United States Patent
Ohnuki

(10) Patent No.: US 8,188,750 B2
(45) Date of Patent: May 29, 2012

(54) BATTERY MODULE VOLTAGE DETECTOR

(75) Inventor: Yasumichi Ohnuki, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 354 days.

(21) Appl. No.: 12/698,682

(22) Filed: Feb. 2, 2010

(65) Prior Publication Data

US 2010/0134115 A1    Jun. 3, 2010

Related U.S. Application Data

(63) Continuation-in-part of application No. 12/323,013, filed on Nov. 25, 2008, now abandoned.

(30) Foreign Application Priority Data

Nov. 26, 2007  (JP) ................. 2007-303915
Nov. 26, 2007  (JP) ................. 2007-303918
Sep. 24, 2008  (JP) ................. 2008-244594
Feb. 3, 2009   (JP) ................. 2009-022557

(51) Int. Cl.
*G01N 27/416* (2006.01)
*H02J 7/00* (2006.01)
*H02J 1/10* (2006.01)

(52) U.S. Cl. ........ 324/429; 324/426; 324/434; 320/116; 320/118; 320/119; 320/121; 320/122; 320/134; 320/149; 320/166; 307/43; 307/44; 307/45

(58) Field of Classification Search ................. 324/429; 320/116
See application file for complete search history.

(56) References Cited

U.S. PATENT DOCUMENTS 6,803,766 B2    10/2004  Kobayashi et al.
7,078,908 B2 *   7/2006  Fujita et al. ............. 324/433
7,714,540 B2 *   5/2010  Shibuya et al. .......... 320/119

FOREIGN PATENT DOCUMENTS

| EP | 1391962 A1 | 2/2004 |
| JP | 2002-286766 A | 10/2002 |
| JP | 2002-343445 A | 11/2002 |
| JP | 2005-003618 A | 1/2005 |

* cited by examiner

*Primary Examiner* — Patrick Assouad
*Assistant Examiner* — Nathaniel Pelton
(74) *Attorney, Agent, or Firm* — Arent Fox, LLP

(57) ABSTRACT

A battery module voltage detector can reduce the difference in frequency response of an anti-aliasing filter for each battery module whose voltage is measured, and provide an accurate voltage measurement. The battery module voltage detector includes a plurality of switches connected to battery modules constituting a battery pack, resistors having an equal resistance value, and a filter composed of capacitors having equal capacitance and being disposed between the battery modules and the switches. The capacitors are divided into a first capacitor group and a second capacitor group which are symmetrical at the center of the battery pack. The first capacitor group is on the positive terminal side of the second battery. The second capacitor is on the negative terminal side of the battery pack. Capacitors may be connected between an output terminal of a (1+M/2)-th resistor and an N-th resistor, except a (1+m/2), the (1+M/2)-th resistor and the N-th resistor.

12 Claims, 34 Drawing Sheets

FIG.6

| CAPACITANCES OF: | BATTERY MODULE NUMBER | | | | | | | | | | | m |
|---|---|---|---|---|---|---|---|---|---|---|---|---|
| | 2 | 3 | 4 | 5 | 6 | 7 | 8 | 9 | 10 | 11 | 12 | m |
| FIRST BATTERY MODULE | 2 | 3 | 4 | 5 | 6 | 7 | 8 | 9 | 10 | 11 | 12 | 2(m−1) |
| SECOND BATTERY MODULE | 2 | 4 | 6 | 8 | 10 | 12 | 14 | 16 | 18 | 20 | 22 | 3(m−2) |
| THIRD BATTERY MODULE | | 3 | 6 | 9 | 12 | 15 | 18 | 21 | 24 | 27 | 30 | 4(m−3) |
| FOURTH BATTERY MODULE | | | 4 | 8 | 12 | 16 | 20 | 24 | 28 | 32 | 36 | 5(m−4) |
| FIFTH BATTERY MODULE | | | | 5 | 10 | 15 | 20 | 25 | 30 | 35 | 40 | 6(m−5) |
| SIXTH BATTERY MODULE | | | | | 6 | 12 | 18 | 24 | 30 | 36 | 42 | 7(m−6) |
| SEVENTH BATTERY MODULE | | | | | | 7 | 14 | 21 | 28 | 35 | 42 | 8(m−7) |
| EIGHTH BATTERY MODULE | | | | | | | 8 | 16 | 24 | 32 | 40 | 9(m−8) |
| NINTH BATTERY MODULE | | | | | | | | 9 | 18 | 27 | 36 | 10(m−9) |
| TENTH BATTERY MODULE | | | | | | | | | 10 | 20 | 30 | 11(m−10) |
| ELEVENTH BATTERY MODULE | | | | | | | | | | 11 | 22 | 12(m−11) |
| TWELFTH BATTERY MODULE | | | | | | | | | | | 12 | |

BATTERY MODULE VOLTAGE DETECTOR

CROSS-REFERENCE TO RELATED APPLICATIONS

This application is a continuation-in-part application of U.S. patent application Ser. No. 12/323,013 filed on Nov. 25, 2008 titled "VOLTAGE DETECTING DEVICE FOR BATTERY MODULES" the disclosure of which is hereby incorporated by reference as if set forth fully herein and claims the foreign priority benefit under Title 35, United States Code, §119 (V1)-(d), of Japanese Patent Application No. 2007-303915, filed on Nov. 26, 2007 in the Japan Patent Office, No. 2007-303918, filed on Nov. 26, 2007 in the Japan Patent Office, Japanese Patent Application No. 2008-244594, filed on Sep. 24, 2008 in the Japan Patent Office, and Japanese Patent Application No. 2009-022557, filed on Feb. 3, 2009 in the Japan Patent Office, the disclosures of which are herein incorporated by reference in entirety.

U.S. patent application Ser. No. 12/323,013 claims the foreign priority benefit under Title 35, United States Code, §119 (V1)-(d), of Japanese Patent Application No. 2007-303915, filed on Nov. 26, 2007 in the Japan Patent Office, No. 2007-303918, filed on Nov. 26, 2007 in the Japan Patent Office, and Japanese Patent Application No. 2008-244594, filed on Sep. 24, 2008 in the Japan Patent Office, the disclosures of which are herein incorporated by reference in entirety.

BACKGROUND OF THE INVENTION

1. Field of the Invention

The present invention relates to a voltage detecting device for battery modules to detect the voltage of each battery module of a battery pack.

2. Description of the Related Art

For example, an electric power for an electric vehicle and a hybrid vehicle is supplied from a battery pack comprised of a number of cells connected in series. Accordingly, the voltage of a battery module which is a series circuit of a plurality of cells is normally monitored.

According to a method of detecting the voltage of the battery module of the battery pack, there is known a measuring method by which an output voltage of the battery module to be measured is applied to one capacitor by sequentially switching switches, so that the capacitor is charged, and a voltage across the capacitor is measured by a differential amplifier.

When an A/D (analog to digital) converter converts an analog output signal of the differential amplifier into a digital signal, aliasing occurs due to noise caused by frequencies higher than half a sampling frequency. Preferably, an anti-aliasing filter is applied between the switch and a battery module to be measured so as to prevent the aliasing.

JP 2005-003618A discloses a voltage detecting circuit which includes an anti-aliasing filter for each battery module. The anti-aliasing filter is a low-pass filter composed of a resistor and a capacitor.

However, the technology disclosed in JP 2005-003618A has the problem in occurring the difference in frequency response between the battery modules and having an inhomogeneous filter characteristic with respect to each battery module since a resistor connected between the battery modules is commonly used. In other words, when two sets of resistors are provided for each battery module, the frequency response is equalized. However, when the resistor between the battery modules is commonly provided in order to reduce the number of electronic parts, the frequency response becomes inhomogeneous. In this case, even if there is no difference in an output voltage waveform of each battery module, there appears the difference in the voltage waveform of each battery module through a filter. Accordingly, it is erroneously determined that the battery module is in an irregular condition. In particular, since the voltage detecting circuit of JP 2005-003618A amends the difference in frequency response between the battery modules on the basis of a constant value of electronic parts, the constant value needs to be strictly determined. If the constant value is erroneously determined, an error resulting from variance of the constant value is considerably large. For example, if a photo MOS relay having a predetermined delay time in switching is provided for a switch, a sampling frequency of switching cannot be raised due to a long delay time. Consequently, the voltage detecting device including the photo MOS relay is affected by the noise of a relatively low frequency.

BRIEF SUMMARY OF THE INVENTION

An aspect of the present invention provides a battery module voltage detector for reducing a difference in frequency response among battery modules whose voltages are detected.

A first aspect of the present invention provides a battery module voltage detector that detects a voltage of each of battery modules, wherein each battery module including one cell or more, and M battery modules are connected in series as a battery pack, and "M" is a positive integer, the battery module voltage detector comprising:

(M+1) voltage detecting terminals connected to a positive electrode of a battery module having a highest potential, a negative electrode of a battery module having a lowest potential, and (M−1) connecting points between the battery modules adjacent to each other, respectively;

a filter circuit having input terminals which are connected to the voltage detecting terminals, respectively;

switching circuits having input terminals which are connected to output terminals of the filter circuit, respectively; and a voltage detecting circuit connected to output terminals of the switching circuit to detect the voltage of each battery module, wherein the filter circuit includes a resistor-and-capacitor arrangement including resistors that are connected between the input terminals and the output terminals of the filter circuit, respectively, and capacitors that are connected between output terminals of the filter circuit, respectively, to have a characteristic of a low-pass filter, and wherein the resistor-and-capacitor configuration of the low-pass filter is determined by adjusting a resistance value and position of the resistor in the resistor-and-capacitor arrangement as well as capacitance and position of the capacitor in the resistor-and-capacitor arrangement, so that frequency response is kept constant when the voltage of the plurality of battery modules is detected.

A second aspect of the present invention provides a battery module voltage detector according to the first aspect, wherein when "M" and "N" are a positive integer, the resistor-and-capacitor arrangement is made up of (M+1) resistors having an equal resistance value to connect an N-th input terminal of the filter circuit to an N-th output terminal of the filter circuit, and M capacitors whose terminals are connected between the output terminals of two adjacent resistors out of the (M+1) resistors. When capacitance of the capacitor corresponding to a first battery module is regarded as "one", capacitance ratio of the capacitor corresponding to an N-th battery module is expressed as "N(M−N+1)/M".

A third aspect of the present invention provides a battery module voltage detector according to the first aspect, wherein, when the number of battery modules is "M" being a positive and uneven integer and "N" is a positive integer, the resistor-and-capacitor arrangement is made up of (M+1) resistors having an equal resistance value to connect an N-th input terminal of the filter circuit to an N-th output terminal of the filter circuit, and (M+1)/2 capacitors having equal capacitance and connected to the output terminals of N-th and (M+2−N)-th resistors out of the (M+1) resistors.

A fourth aspect of the present invention provides a battery module voltage detector according to the first aspect, wherein when the number of battery modules is "M" being a positive and even integer and "N" is a positive integer, the resistor-and-capacitor arrangement is made up of a resistor having an arbitrary resistance value, including a zero ohm resistor, to connect M/2-th input terminal of the filter circuit to M/2-th output terminal of the filter circuit, M resistors having an equal resistance value to connect an N-th input terminal of the filter circuit to an N-th output terminal of the filter circuit, apart from M/2-th input terminal of the filter circuit, and M/2 capacitors having equal capacitance and connected between the output terminals of N-th and (M+2−N)-th resistors out of (M+1) resistors.

A fifth aspect of the present invention provides battery module voltage detector according to the third and fourth aspects, wherein when "M", "P", and "Q" are a positive integer, "P" is less than half of "M", and "Q" is not equal to "P" and less half of "M", and wherein a capacitor connected between P-th and (M+2−P)-th resistors and a capacitor between Q-th and (M+2−Q)-th resistors are replaced with a capacitor connected between the Q-th and P-th resistors, a capacitor connected between the P-th and (M+2−Q)-th resistors, a capacitor connected between the Q-th and (M+2−P)-th resistors, and a capacitor connected between the (M+2−Q)-th and (M+2−P)-th resistors, and all the capacitors have approximately equal capacitance.

A sixth aspect of the present invention provides a battery module voltage detector according to the first aspect, wherein "M" is a positive integer, and a resistor connected between M/2-th input terminal of the filter circuit and M/2-th output terminal of the filter circuit is replaced with a wire.

A seventh aspect of the present invention provides a battery module voltage detector according to the first aspect, wherein the resistor is provided as a dummy load by a switching capacitor method of providing the capacitor and a plurality of switches.

An eighth aspect of the present invention provides a battery module voltage detector according to the first aspect, wherein the switching circuit is an analog multiplexer integrally and separately constituted with the voltage detecting circuit.

A ninth aspect of the present invention provides battery module voltage detector according to the first aspect, wherein the filter circuit includes:

(M+1) input terminals connected to the voltage detecting terminals;

(M+1) output terminals that are connected to the voltage detector through the switch circuit;

(M+1) resistors connected between the input terminals and output terminals of the filter circuit, respectively, the resistors having substantially the same resistance except (1+M/2)-th resistor; and M capacitors connected between an output terminal of a (1+M/2)-th resistor and an N-th resistor, N being one to (M+1) except a (1+M/2), the (1+M/2)-th resistor and the N-th resistor being successively counted from the resistor connected to the positive electrode of the battery module having a highest potential or the negative electrode of a battery module having a lowest potential.

A tenth aspect of the present invention provides battery module voltage detector according to the ninth aspect, wherein the (1+M/2)-th resistor has a smaller resistance than the other resistors.

A first battery module voltage detector individually detects a voltage of the battery module of the battery pack 11 which includes M (a positive integer) battery modules composed of at least one cell or more and connected in series. The first battery module voltage detector includes a plurality of switches 14 connected to both terminals of each battery module, resistors having an equal resistance value and connected in series between both terminals of each battery module and the switches, filters 12 composed of the resistors and capacitors having equal capacitance. When the number M of battery modules is an even number, the resistor connected to the terminals of the battery modules disposed at the center of a circuit can have an arbitrary resistance value. The capacitors are respectively connected in parallel with the battery module and connected to contact points which are disposed between the resistors and the switches. The capacitors constituting the filter provide a first capacitor group and a second capacitor group, which is disposed in parallel with the first capacitor group. The first capacitor group and the second capacitor group are symmetrically disposed on a positive terminal side and a negative terminal side of the battery pack whose center is a fold-back point, so that the circuit including the first capacitor group and the second capacitor group can provide an approximately equal frequency response with respect to each battery module to be measured.

When the number M of battery modules of the first battery module voltage detector is three, a second battery module voltage detector includes a circuit having the battery pack and the filter. The circuit comprises three sets of battery modules connected in series, four resistors (for example, R31, R32, R33, and R34) having an equal resistance value and, two end capacitors (for example, C31 and C34) having the equal capacitance, a negative-electrode-side peripheral capacitor (for example, C32) having the equal capacitance, and a positive-electrode-side peripheral capacitor (for example, C33) having the equal capacitance.

The resistors R31, R32, R33, and R34 are connected in series between the switches and both terminals of each battery module. The end capacitors C31 and C34 are connected between contact points which are disposed between the switches and the resistors R31, R32, R33, and R34. The resistors R31, R32, R33, and R34 are connected to both terminals of end battery modules out of the three battery modules connected in series. The negative-electrode-side peripheral capacitor C32 is connected between contact points which are disposed between the switches and the resistors R31 and R34. The resistors R31 and R34 are connected to a negative-electrode terminal of the top battery module out of the three battery modules connected in series and a negative-electrode terminal of the end battery module out of the three battery modules connected in series. The positive-electrode-side peripheral capacitor C33 is connected between contact points which are disposed between the switches and the resistors R31 and R33. The resistors R31 and R33 are connected to a positive-electrode terminal of the end battery module out of the three battery modules connected in series and a positive-electrode terminal of the top battery module out of the three battery modules connected in series.

When the number M of battery modules of the first battery module voltage detector is 4n (n is a positive integer), a third battery module voltage detector includes a circuit having a battery pack and a filter. The circuit comprises the four-battery-module-type battery unit having N filters sequentially being nested at the fold-back point.

When the number M of battery modules of the first battery module voltage detector is (4n+1) (n is a positive integer), a fourth battery module voltage detector includes a circuit having the battery pack and the filter. The circuit comprises the four-battery-module-type battery unit having N filters sequentially being nested at the fold-back point, and the one-battery-module-type battery unit disposed between the second and third battery modules of the four-battery-module-type battery unit disposed at the fold-back point.

When the number M of battery modules of the first battery module voltage detector is (4n+2) (n is a positive integer), a fifth battery module voltage detector includes a circuit having the battery pack and the filter. The circuit comprises the four-battery-module-type battery unit having N filters sequentially being nesting at the fold-back point, and the two-battery-module-type battery unit disposed between the second and third battery modules of the four-battery-module-type battery unit disposed at the fold-back point.

When the number M of battery modules of the first battery module voltage detector is (4n+3) (n is a positive integer), a sixth battery module voltage detector includes a circuit having the battery pack and the filter. The circuit comprises the four-battery-module-type battery unit having N filters sequentially being nested at the fold-back point, and the three-battery-module-type battery unit disposed between the second and third battery modules of the four-battery-module-type battery unit disposed at the fold-back point.

A seventh battery module voltage detector is based on the fourth battery module voltage detector, and includes the one-battery-module-type battery unit whose circuit is composed of a set of battery module and one-battery-module filter block which includes two resistors having the equal resistance value and capacitors having the equal capacitance. The two resistors are disposed in series between the switches and both terminals of the battery module. The capacitors are connected between contact points which are disposed between the switches and the resistors connected to both terminals of the battery module, An eighth battery module voltage detector is based on the fifth battery module voltage detector, and includes two battery modules connected in series and the two-battery-module-type battery unit whose circuit is composed of two-battery-module filter block which includes two resistors having the equal resistance value and capacitors having the equal capacitance. The two resistor's are out of three resistors connected in series between the is switches and both terminals of the battery modules, apart from the resistor connected to the central terminal. The capacitors are connected to a positive-electrode terminal of the top battery module out of the two battery modules connected in series and a negative-electrode terminal of the end battery module out of the two battery modules connected in series.

A ninth battery module voltage detector is based on the sixth battery module voltage detector, add includes the three-battery-module-type battery unit whose circuit is composed of three battery modules connected in series and three-battery-module filter block which includes four resistors having the equal resistance value, two end capacitors having the equal capacitance, a negative-electrode-side peripheral capacitor having the equal capacitance, and a positive-electrode-side peripheral capacitor having the equal capacitance.

The four resistors are connected in series between the switches and both terminals of the three battery modules. The two end capacitors. The two end capacitors are connected between contact points which are disposed between the switches and the resistors connected to both terminals of end battery modules out of the three battery modules connected in series. The negative-electrode-side peripheral capacitor is connected between contact points which are disposed between the switches and the two resistors. The two resistors are respectively connected to a negative-electrode terminal of the top battery module out of the three battery modules connected in series and a negative-electrode terminal of the end battery module out of the three battery modules connected in series. The positive-electrode-side peripheral capacitor is connected between contact points which are disposed between the switches and another two resistors. The two resistors are respectively connected to a positive-electrode terminal of the end battery module out of the three battery modules connected in series and a positive-electrode terminal of the top battery module out of the three battery modules connected in series.

A tenth battery module voltage detector is based on any one of the third to sixth voltage detecting devices for battery modules, and includes the-four-battery-module-type battery unit whose circuit is composed of four battery modules connected in series and the four-battery-module filter block which includes four resistors having the equal resistance value, two end capacitors having the equal capacitance, a negative-electrode-side peripheral capacitor having the equal capacitance, and a positive-electrode-side peripheral capacitor having the equal capacitance.

The resistors are connected in series between the switches and both terminals of the four battery modules, apart from the resistor connected to the central terminal. The two end capacitors are connected between contact points which are disposed between the switches and the resistors connected to both terminals of end battery modules out of the battery modules constituting the four-battery-module-type battery unit. The negative-electrode-side peripheral capacitor is connected between contact points which are disposed between the switches and the two resistors. The two resistors are respectively connected to a negative-electrode terminal of the top battery module out of the battery modules connected in series and a negative-electrode terminal of the end battery module out of the battery modules connected in series. The positive-electrode-side peripheral capacitor is connected between contact points which are disposed between the switches and another two resistors. The two resistors are respectively connected to a positive-electrode terminal of the end battery module out of the battery modules connected in series and a positive-electrode terminal of the top battery module out of the battery modules connected in series.

The voltage detecting device for the battery module of the present invention can reduce the difference in frequency response of the battery module whose voltage is detected.

BRIEF DESCRIPTION OF THE DRAWINGS

FIG. 6 is a table of the number of battery modules corresponding to the ordinal position of a capacitor in order to show a capacitance ratio of the capacitor constituting the anti-aliasing filter.

DETAILED DESCRIPTION OF THE PREFERRED EMBODIMENTS

First Embodiment

Figure 1:
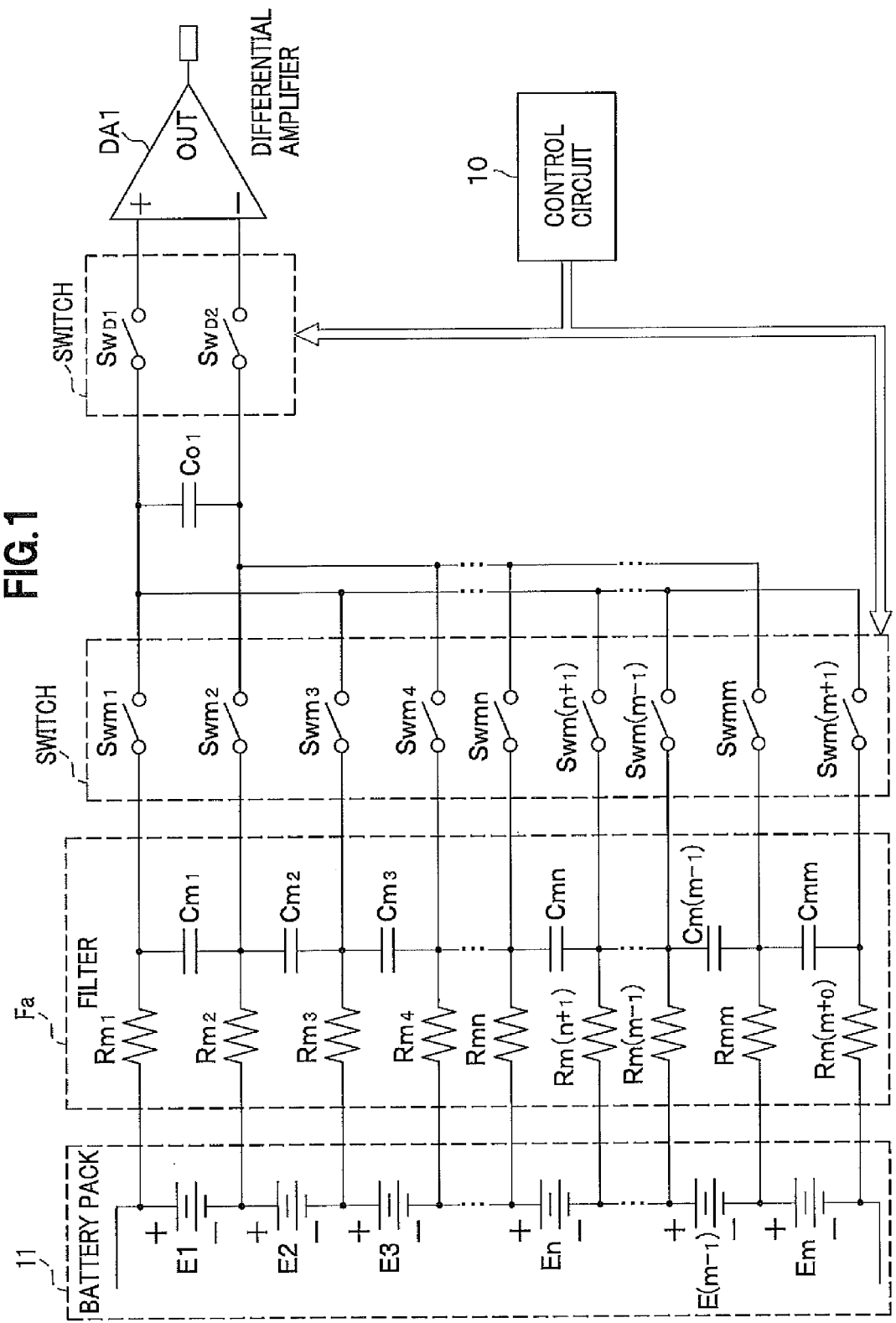
FIG. 1 is a block diagram of a battery module voltage detector of a first embodiment of the present invention.

FIG. 1 is a block diagram of a battery module voltage detector of an embodiment of the present invention.

In FIG. 1, the battery module voltage detector of the embodiment measures the voltage of a battery module in a battery pack 11. The battery pack 11 includes a plurality of battery modules E1 to En, and Em connected in series and manufactured under the same standard. The battery module voltage detector includes an anti-aliasing filter Fa, switches Swm1 to Swm(m+1), a capacitor Co1, switches Swd1 and Swd2, a differential amplifier DA1, and a control circuit 10. A photo MOS (Metal Oxide Semiconductor) relay is applied for the switches Swm1 to Swm(m+1) and the switches Swd1 and Swd2.

Since the voltage of the whole battery pack 11 is too high to be measured, and each operation of the battery modules E1 to Em needs to be determined, the voltage of each battery module is measured by sequentially controlling the opening and closing of the switches Swm1 to Swm(m+1).

For example, when a battery module E1 is measured, a pair of switches Swm1 and Swm2 is closed, a voltage of the battery module E1 is applied, and the capacitor Co1 is charged. The pair of switches Swm1 and Swm2 is opened after a predetermined time period, the switches Swd1 and Swd2 are closed, and an A/D (analog to digital) converter (not shown) detects a voltage applied to the capacitor Co1 via a differential amplifier DA1. The voltage of the battery modules E1 to Em is sequentially detected.

The capacitor Co1 is charged when a voltage applied to one of the capacitors Cm1 to Cmm is applied to the capacitor Co1 by closing a pair of switches out of switches Swm1 to Swm(m+1) which are connected to output terminals of the battery modules via resistors. The pair of switches is opened after a predetermined time period, the switches Swd1 and Swd2 are closed, and the A/D converter detects a voltage applied to the capacitor Co1 via the differential amplifier DA1. The voltage of the battery module is determined on the basis of the detecting value. A control circuit 10 controls turning on/off the switches Swm1 to Swm(m+1) and the switches Swd1 and Swd2 during operation.

Hereinafter, the operation of the anti-aliasing filter will be described. The anti-aliasing filter mainly eliminates an alternating-current component (noise component) of the voltage of the battery module with respect to the battery module voltage detector. Even alternating-current voltage component is superposed on the voltage of each battery modules. The anti-aliasing filter is provided to eliminate an alternating-current component in a frequency bandwidth (bandwidth higher than half the sampling frequency), in which the aliasing occurs, from the superposed alternating-current component.

The anti-aliasing filter will be described with reference to FIG. 2, where one battery module is provided.

In the case where the impedance (resistance value) of resistors R01 and R02 is "R", capacitance of a capacitor C01 is "C0", and the impedance of the capacitor C01 is "Z". "Z" is described as follows; $Z=(1/j\omega C0)$. When an alternating-current voltage component V1 of the battery module E1 is an input, and a voltage applied to the capacitor C01 is an output, an input-output gain G1 is described as follows;

$$G1 = VC1/V1 = Z/(2R+Z) \quad (1)$$

FIG. 3 shows the case where two battery modules are provided.

Figures 3A, 3B, 3C:
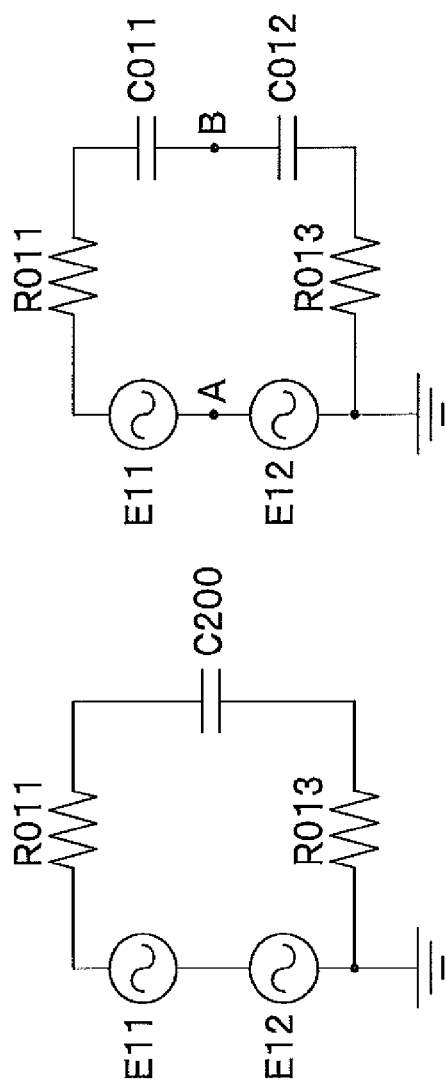
FIG. 3 is a circuit diagram of the anti-aliasing filter where two battery modules are provided.

In FIG. 3A, a resistance value of resistors R011 and R013 is "R", a capacitance value of a capacitor C200 is "C0", the impedance of the capacitor C200 is "Z", and alternating-current voltage components of battery modules are "V11", and "V12" respectively, namely, (V11=V12=Vi). In the case where any one of an alternating-current voltage component V11 of a battery modules E11 and an alternating-current voltage component V12 of a battery modules E12 is an input, which is equal to a voltage Vi, and a voltage VC200 applied to a capacitor C200 is an output, an input-output gain G200 is described as follows;

$$G200 = VC200/VI = 2Z/(2R+Z) \quad (2)$$

As shown in FIG. 3B, the capacitor C200 having the capacitance value C0 (FIG. 3A) is replaced with two capacitors C011 and C012 connected in series and having a capacitance value 2C0 twice as much as the capacitance value C0.

According to this replacement, the output voltage VC200 is evenly divided in two. In this case that voltages VC11 and VC12 applied to the capacitors C011 and C012 are an output respectively, an input-output gain G2 is described as follows;

$$G2 = VC11/VI = VC12/VI = /(2R+Z) \quad (3)$$

Figure 2:
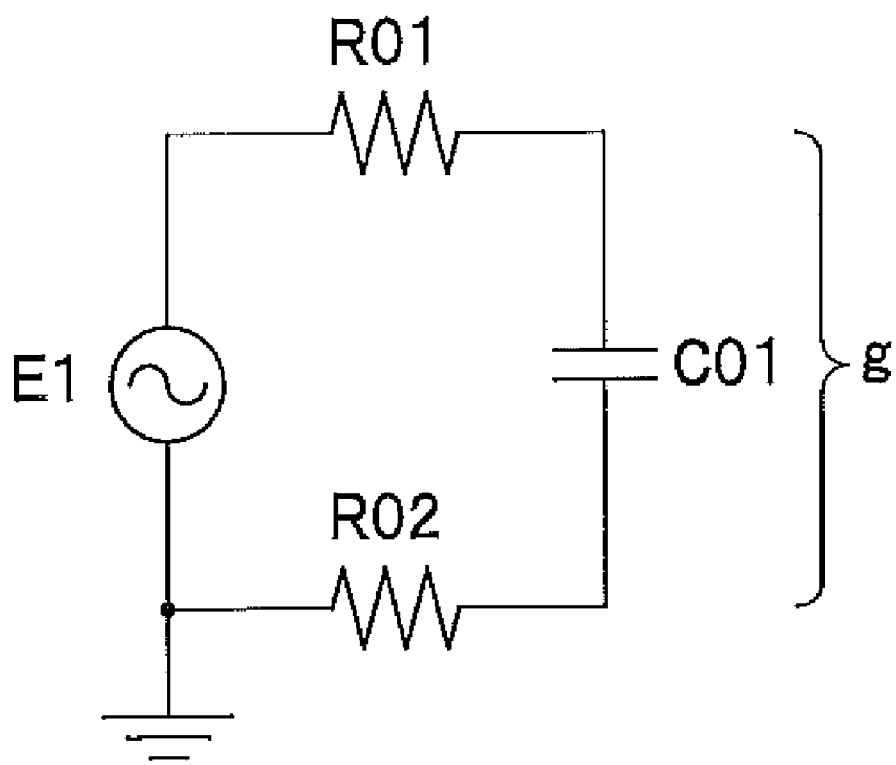
FIG. 2 is a circuit diagram of an anti-aliasing filter where one battery module is provided.

As equations (1) and (3) become equal, each of two filters in FIG. 3B has an equivalent frequency response of one filter in FIG. 2 where one battery module is provided.

An electric potential of a point A disposed between the battery module E11 and the battery module E12 becomes equal to that of a point B disposed between the capacitor C011 and the capacitor C012. Accordingly, these points can be connected via a resistor R012 having a predetermined resistance value. FIG. 3B can be replaced with FIG. 3C.

In this case that a capacitance value of the capacitor C200 is "C0", a capacitance value C' of the capacitors C011 and C012 is described as follows;

$$C' = 2 \times C0 = 2C0$$

FIG. 4 shows the case that three battery modules are provided.

Figure 4A:
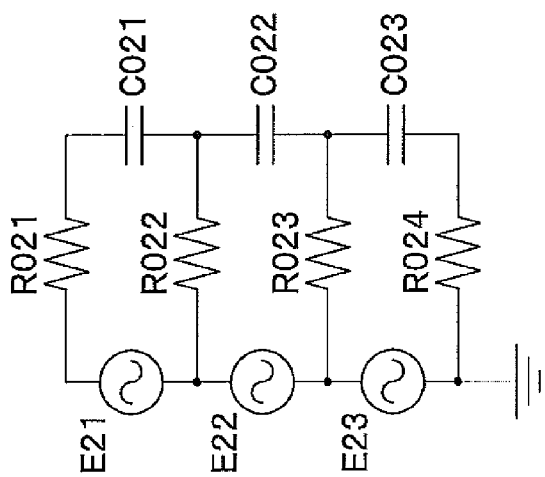
FIG. 4 is a circuit diagram of the anti-aliasing filter where three battery modules are provided.

In FIG. 4A where a resistance value of resistors R021 to R024 is "R", a capacitance value of capacitors C200 and C300 is "C0", the impedance of the capacitors C200 and C300 is "Z", alternating-current voltage components of battery modules E21, E22, and E23 are "V21", "V22", and "V23" respectively. The alternating-current voltage components V21, V22, and V23 are equal to a voltage Vi (V21=V22=V23=Vi). In the case that the voltage Vi is an input, and the voltage VC20 applied to the capacitor C20 is an output, an input-output gain Gc20 described as follows;

$$Gc20 = VC20/Vi = Z/(2R+Z)$$

$$G300 = VC300/Vi = 3Z/(2R+Z)$$

Figure 4B:
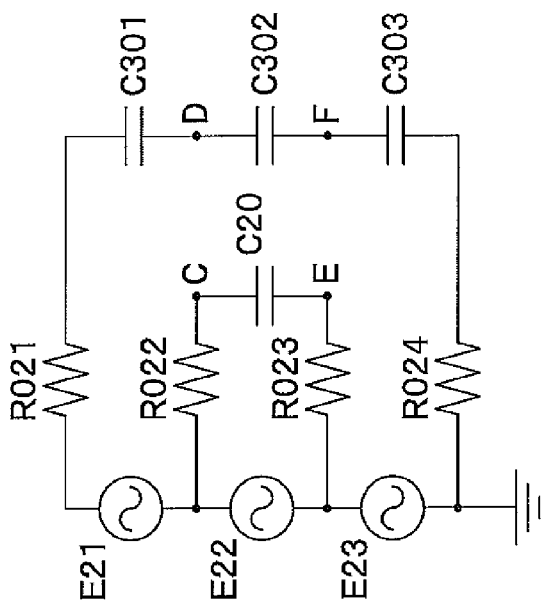

As shown in FIG. 4B, the capacitor C300 having the impedance Z is replaced with three capacitors C301, C302, and C303, each of the three capacitors has a third of the impedance Z.

According to this replacement, the total output voltage of the battery modules E21, E22, and E23 is evenly divided into three. In the case that each voltage applied to the capacitors C301, C302, and C303 is an output, the input-output gains G301, G302, and G303 are respectively described as follows;

$$G301 = VC301/Vi$$

$$= G302 = VC302/Vi$$

$$= G303 = VC303/Vi = Z/(2R+Z)$$

In this time, each capacitance value of the capacitors C301, C302, and C303 is equal to a capacitance value C3 which is a third of the capacitance value C0 of the capacitors C300.

$$C3 = 3 \times C0$$

Figure 4C:
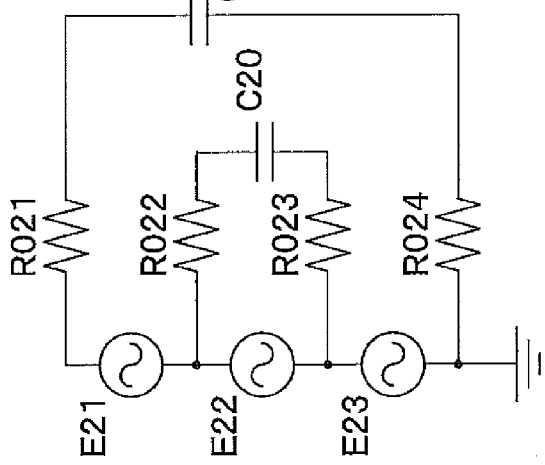

Electric potentials across the capacitor C302 disposed between points D and F are equal to electric potentials across the capacitor C20 is posed between points C and E. Accordingly, the point C can be connected to the point D, and the point E connected to the point F. As shown in FIG. 4C, the capacitors C20 and C302 can be replaced with one capacitor C022. According to this replacement, capacitance values C'021, C'022, and C'023 of the capacitors C021, C022, and C023 are described as follows;

$$C'021 = 3C0$$

$$C'022 = 3C0 + C0 = 4C0$$

$$C'023 = 3C0$$

In this time, each gain of the filters is described as Z/(2R+Z), so that each of three filters in FIG. 4C has an equivalent frequency response of one filter where one battery module is provided.

FIG. 5 shows the case that four battery modules are provided.

Figure 5C:
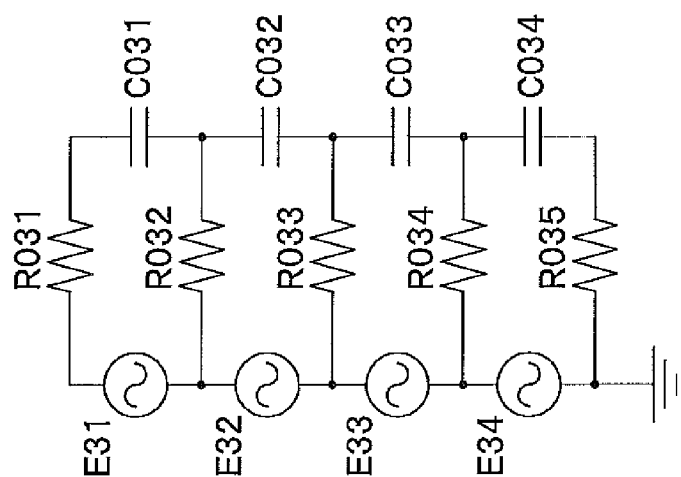
FIG. 5 is a circuit diagram of the anti-aliasing filter where four battery modules are provided.
Figure 5B:
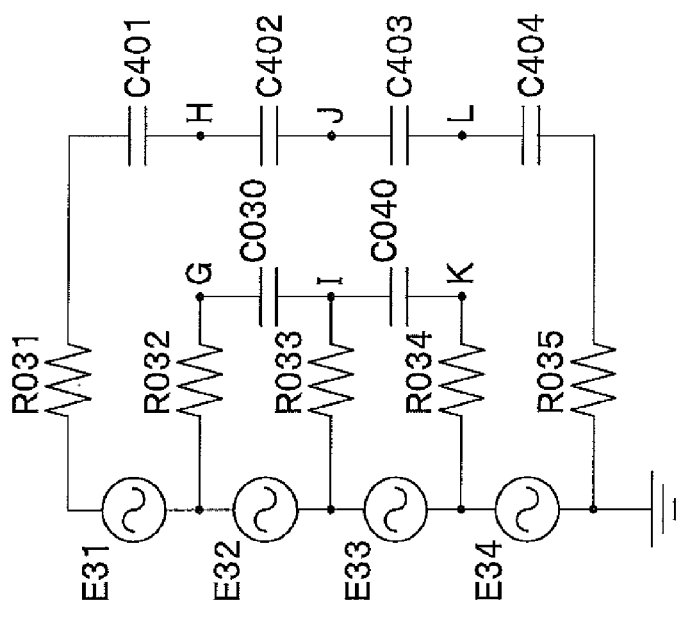
Figure 5A:
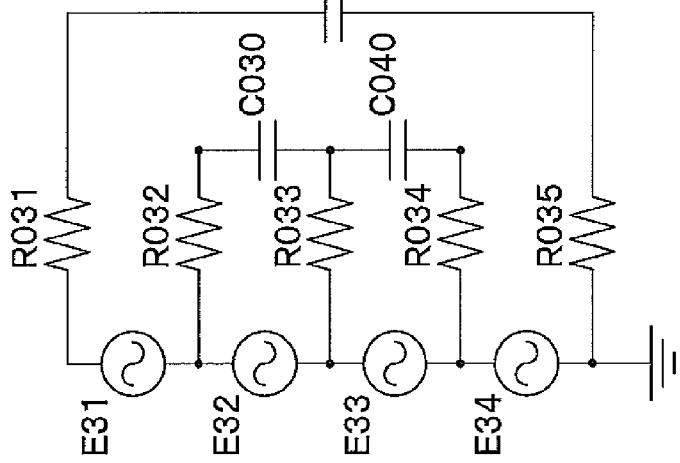

In FIG. 5A where a resistance value of resistors R031 to R035 is "R", a capacitance value of capacitors C030 and C040 is "2C0", an impedance of the capacitors C030 and C040 is "Zc30", the impedance Zc30 is described as follows;

$$Zc30 = Zc40 = Z/2$$

In the case that the capacitance value of a capacitor C400 is "C0", and the impedance of the capacitor C400 is "Z", and alternating-current voltage components V31, V32, V33, and V34 of battery modules E31, E32, E33, and E33 are described as follows;

$$V31 = V32 = V33 = V34 = Vi$$

In the case that the voltage Vi is an input, and the voltages VC30 and VC40 applied to the capacitors C030 and C040 are an output respectively, the input-output gains Gc30 and Gc40 are described as follows;

$$Gc30 = VC30/Vi = Gc40 = VC40/Vi = Z/(2R+Z)$$

In the case that 4Vi is an input, and the voltage VC400 applied to the capacitor C400 are an output, the input-output gain G400 is described as follows;

$$G400 = VC400/Vi = 4Z/(2R+Z)$$

As shown in FIG. 5B, the capacitor C400 having a capacitance value C0 is replaced with four capacitors C401, C402, C403, and C404 connected in series, and each capacitance value C4 of the four capacitors is four times as much as the capacitance value C0 (a fourth of the impedance Z).

According to this replacement, a total output voltage of battery modules E31, E32, E33 and E34 is evenly divided into four. In the case that respective voltages VC401 to VC404 applied to the capacitors C401 to C404 are an output, and the input voltage Vi is an input, input-output gains G401 to G404 are respectively described as follows;

$$G401 = VC401/Vi$$

$$= G402 = VC402/Vi$$

$$= G403 = VC403/Vi$$

$$= G404 = VC404/Vi = Z/(2R+Z)$$

In this case that the capacitance value of the capacitor C400 is "C0", each of capacitance values C401a, C402a, C403a, and C404a of the capacitors C401, C402, C403 and C404 is four times as much as the capacitance value C0.

$$C401a = C402a = C403a = C404a = 4C0$$

As described above with reference to FIG. 4, according to FIG. 5B electric potentials at point G and H are equal, so that the two points G and H can be connected. Furthermore, electric potentials at point I and J are equal, so that the two points I and J can be connected. Electric potentials at point K and L are equal, so that the two points K and L can be connected. Consequently, FIG. 5B can be replaced with FIG. 5C.

Capacitance values C'031 to C'034 of the capacitors C31 to C34 are respectively described as follows;

$$C'031 = 4C0$$

$$C'032 = 4C0 + 2C0 = 6C0$$

$$C'033 = 4C0 + 2C0 = 6C0$$

$$C'034 = 4C0$$

In this time, the input-output gain of each filter in FIG. 5C is described as Z/(2R+Z), so that each of the filters has an equivalent frequency response of one filter where one battery module is provided.

If the number of battery modules is five or more, the impedance of the capacitor can be determined in the same way described above. The capacitance ratio per capacitor is shown in a table of FIG. 6. The table of FIG. 6 shows a relation of the capacitance of the capacitor based on its ordinal position N to the number M of battery modules. When one battery module is provided, the capacitance of one capacitor is regarded as "one" on the table.

Generally, an arbitrary capacitance value of the capacitor forming the anti-aliasing filter for a battery pack 11 having M battery modules can be described below. The arbitrary capacitance value of each capacitor depends on its ordinal position. A first capacitor is disposed in parallel with the end or top battery module out of a plurality of battery modules composed of the battery pack 11.

| First Capacitor | MC0 |
| Second Capacitor | 2(M − 1)C0 |
| Third Capacitor | 3(M − 2)C0 |
| Fourth Capacitor | 4(M − 3)C0 |
| Fifth Capacitor | 5(M − 4)C0 |
| ... | |
| N number of Capacitor | n(M − N + 1)C0 |
| ... | |
| (M − 1) number of Capacitor | 2(M − 1)C0 |
| M number of Capacitor | MC0 |

Accordingly, the capacitance of the capacitors for the anti-aliasing filter can be adjusted, so that the anti-aliasing filter can reduce the difference in frequency response with respect to the battery pack 11 having an arbitrary number of battery modules.

As mentioned above, the capacitance of the capacitor is described in the ratio based on the reference capacitance value C0. The resistance value R of the resistor constituting the anti-aliasing filter is constant, but not limited. Accordingly, the capacitance value C0 and the resistance value R can be selectable, so that the anti-aliasing can provide a wide range of cut-off frequency.

As described above, the embodiment of the present invention can reduce the difference in frequency response of the battery module whose voltage is detected. When there is no difference in output voltage waveform of each battery module, there is no difference in a voltage waveform through the filter. Consequently, the embodiment of the present invention can prevent the battery modules from erroneously being determined as if it were in an irregular condition. When a photo MOS relay is provided, a sampling frequency of switching is forced to be low due to a long delay in switching. However, as the embodiment of the present invention can reduce the difference in frequency responses, the anti-aliasing filter can provide relatively a high cut-off frequency. The battery module voltage detector includes a flying capacitor wherein a pair of the switches Swm1 and Swm(m+1) and a pair of the switches Swd1 and Swd2 are alternately opened and closed, so that the battery pack 11 and the differential amplifier are insulated with each other.

Second Embodiment

Figure 7:
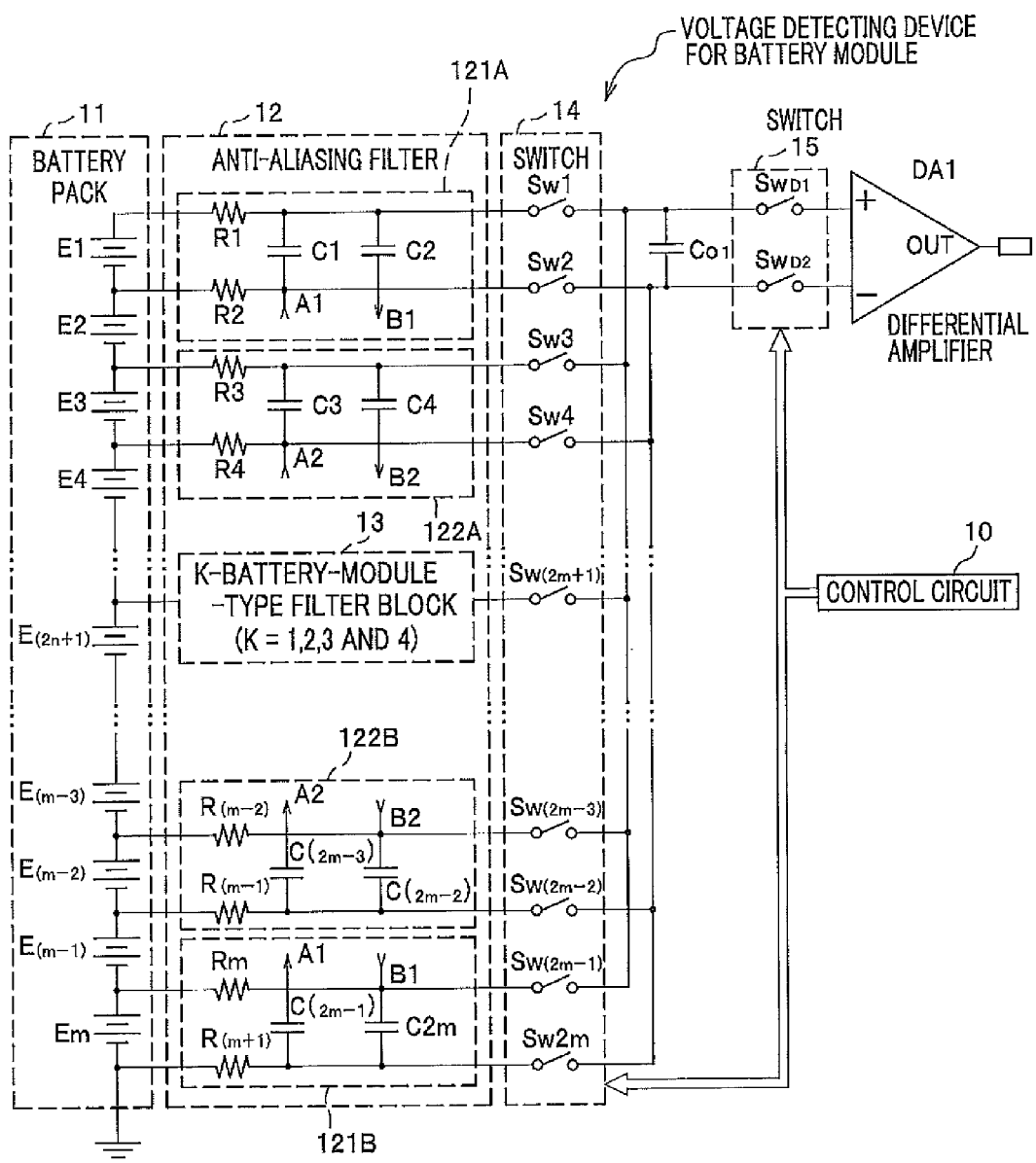
FIG. 7 is a block diagram of a battery module voltage detector of a second embodiment of the present invention.

FIG. 7 is a block diagram showing a battery module voltage detector of a second embodiment of the present invention.

In FIG. 7, the battery module voltage detector of the second embodiment measures the voltage of a battery module constituting a battery pack 11 being the object to be measured. The second battery 11 includes a plurality of battery modules E1 to Em connected in series and manufactured under the same standard. The battery module voltage detector includes an anti-aliasing filter 12, a switch group 14 comprised of switches Sw1 to Sw2m, a capacitor Co1, output switches 15 comprised of switches Swd1 and Swd2, a differential amplifier DA1, and a control circuit 10. A photo MOS relay is applied for the switches Sw1 to Sw2m and the switches Swd1 and Swd2.

As the voltage of the whole battery pack 11 is too high to be measured and each operation of the battery modules E1 to Em needs to be determined, each voltage of battery modules E1 to Em is measured by sequentially controlling the opening and closing of the switches Sw1 to Sw2m.

For example, when a battery module E1 is measured, a pair of switches Sw1 and Sw2 is closed, a voltage of the battery module E1 is applied, and the capacitor Co1 is charged. The pair of switches Sw1 and Sw2 is opened after a predetermined time period, the switches Swd1 and Swd2 are closed, and an A/D (analog to digital) converter (not shown) detects a voltage applied to the capacitor Co1 via a differential amplifier DA1. The voltage of the battery module E1 is determined based on the detected value. The voltage detection process for the battery modules E1 to Em sequentially proceeds in order to determine the voltage of each battery module.

The control circuit 10 controls turning on/off the switches Sw1 to Sw2m and the switches Swd1 and Swd2 during operation.

Hereinafter, the operation of the anti-aliasing filter will be described. The anti-aliasing filter mainly eliminates an alternating-current component (noise component) of the voltage of the battery module with respect to the battery module voltage detector. When the battery pack 11 is charged and discharged as a whole, the alternating-current component is superposed on the voltage of each battery module. The anti-aliasing filter is provided to eliminate the alternating-current component in a frequency bandwidth (bandwidth higher than half the sampling frequency), in which the aliasing occurs, from the superposed alternating-current component.

The anti-aliasing filter 12 is composed of a combination of four-battery-module filter block corresponding to four battery modules and any one of four types of battery module filter blocks, depending on the number of battery modules. When the number M of battery modules is (4n+1), the filter block is one-battery-module filter block corresponding to one battery module positioned in the center of the second battery. When the number M of battery modules is (4n+2), the filter block is two-battery-module filter block corresponding to two battery modules positioned in the center of the battery pack 11. When the number M of battery module is (4n+3), the filter block is three-battery-module filter block corresponding to three battery modules positioned in the center of the battery pack 11. When the number M of battery modules is 4n, the filter block is four-battery-module filter block corresponding to four battery modules positioned in the center of the battery pack 11.

The four-battery-module filter block is symmetrical about a fold-back point which is the center of the battery pack 11 and divided into two groups, which are a positive terminal side and a negative terminal side. On the positive terminal side, N four-battery-module filter blocks are disposed in order from the positive terminal. On the negative terminal side, N sets of the four-battery-module filter blocks are disposed in order from the negative terminal. In FIG. 7, reference numeral 121A denotes the four-battery-module filter block positioned in the nearest to the positive terminal of the battery pack 11 on the positive terminal side, and reference numeral 122A denotes the four-battery-module filter block positioned in the second nearest to the positive terminal. Reference numeral 121B denotes the four-battery-module filter block positioned in the nearest to the negative terminal with respect to the group on the negative terminal side, and reference numeral 122B denotes the four-battery-module filter block positioned in the second nearest to the negative terminal.

Reference numeral 13 denotes any one of the one-battery-module filter block, the two-battery-module filter block, the three-battery-module filter block, and the four-battery-module filter block.

The anti-aliasing filter will be described with reference to FIG. 8, where one battery module is provided.

In the case that the impedance (resistance value) of resistors R11 and R22 is "R", capacitance of a capacitor C11 is "C0", and the impedance of the capacitor C11 is "Z", the impedance Z is described as follows; $Z=(1/j\omega C0)$. In the case that an alternating-current voltage component V11 of the battery module E11 is an input, and a voltage Vo11 applied to the capacitor C11 is an output, an input-output gain G1 is described as follows;

$$G1 = Vo11/V11 = Z/(2R+Z) \quad (4)$$

FIG. 9 shows the case where two battery modules are provided.

Figure 9A:
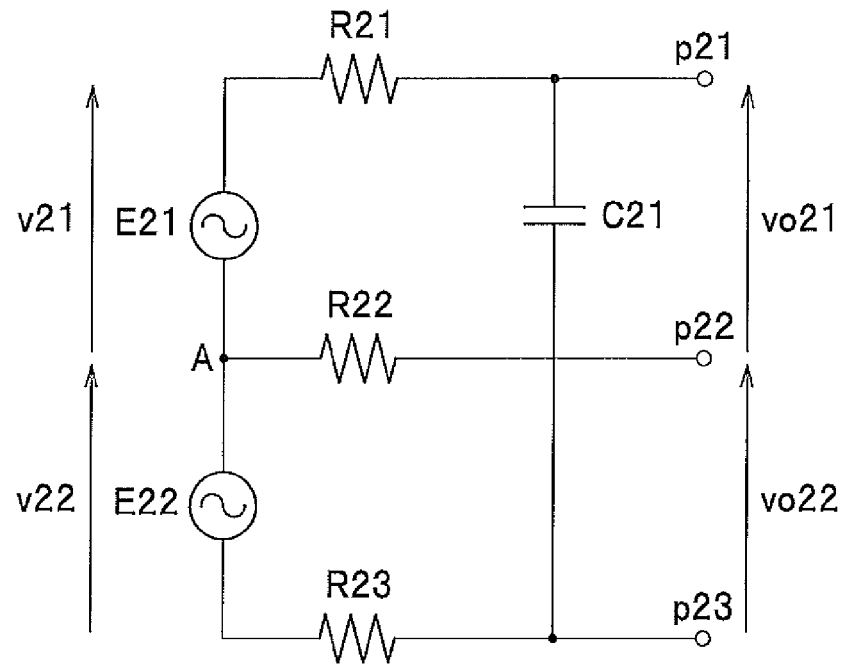
FIG. 9 is a circuit diagram of the voltage detecting device where two battery modules are provided with respect to the battery module voltage detector of the present invention.

In FIG. 9A, a resistance value of resistors R21 and R23 is "R", a capacitance of a capacitor C21 is "C0", an impedance of the capacitor C21 is "Z", and alternating-current voltage components of battery modules E21 and E22 are "V21", and "V22" respectively (V21=V22=Vi).

In the case that the voltage Vi superposed with any one of an alternating-current voltage component V21 of a battery module E21 and an alternating-current voltage component V22 of a battery module E22 is an input, and the voltage VC21 applied to a capacitor C21 is an output, the input-output gain G21 is described as follows;

$$G21 = VC21/Vi = 2Z/(2R+Z) \quad (5)$$

The alternating-current voltage component V21 of the battery module E21 and the alternating-current voltage component V22 of the battery module E22 are equal. A point A is disposed between is the battery module E21 and the battery module E22. Accordingly, an alternating-current voltage component Vo21 between a point 21 on the output side of a resistor R21 and a point 22 on the output side of a resistor R22 is equal to an alternating-current voltage component Vo22 between a point 23 on the output side of a resistor R23 and the point 22 on the output side of the resistor R22. The resistor R22 can be of an arbitrary resistance value.

Accordingly, the voltage VC21 applied to the capacitor C21 is evenly divided in two. When alternating-current voltage components Vo21 and Vo22 is an output respectively, an input-output gain G2 is described as follows;

$$G2 = Vo21/Vi = Vo22/Vi = Z/(2R+Z) \quad (6)$$

As equations (1) and (3) become equal, each of two filters, on which the alternating-current components are applied respectively, has an equivalent frequency response of the filter where one battery module is provided.

Figure 9B:
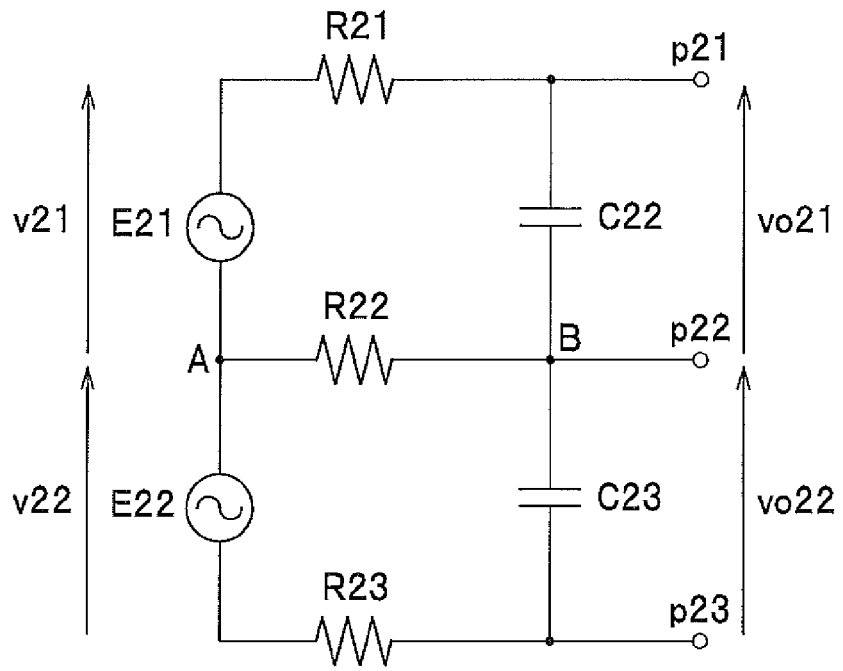

As shown in FIG. 9B, the capacitor C21 having a capacitance value C0 is replaced with two capacitors C22 and C23 connected in series. Each of the capacitors C22 and C23 has twice as much as the capacitance C0.

According to this replacement, the output voltage VC21 is evenly divided in two. In this case that the voltage Vo21 applied to the capacitor C22 and the voltage Vo22 applied to the capacitor C23 are an output respectively, the input-output gain G2 is described as follows;

$$G2 = Vo21/Vi = Vo2/Vi = Z/(2R+Z) \quad (7)$$

Consequently, the equation (7) corresponds to the previous result.

Next, the case where three battery modules are provided will be described.

Figure 10:
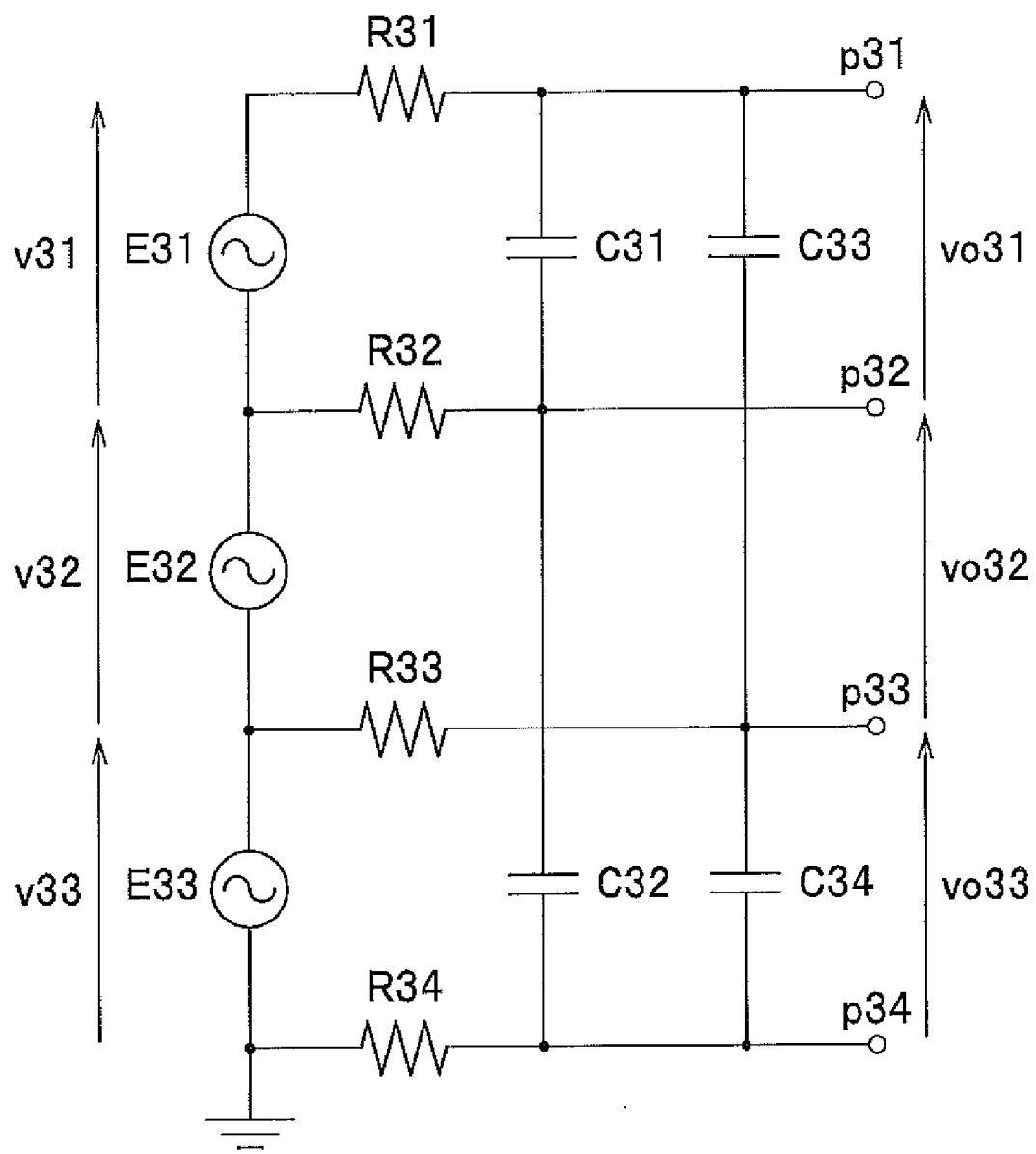
FIG. 10 is a circuit diagram of the voltage detecting device where three battery modules are provided with respect to the battery module voltage detector of the present invention.

In FIG. 10, a resistance value of resistors R34 and R34 is "R", capacitance value of capacitors C31 to C34 is "C0", impedance of the capacitors C31 to C34 is "Z". The battery modules E31 and E33 are called as an end battery module, the capacitors C31 and C34 are called as an end capacitor, the capacitor C32 is called as a negative-side peripheral capacitor, and the capacitor C33 is called as a positive-side peripheral capacitor.

Alternating-current voltage components V31, V32, and V33 of battery modules E31, E32, and E33 are equal to the voltage Vi (V31=V32=V33=Vi).

In this time, alternating-current voltage component Vo31 between an output terminal P32 of a resistor R32 and an output terminal. P31 of a resistor R31 is measured, and an alternating-current voltage component Vo32 between an output terminal P33 of a resistor R33 and the output terminal P32 of the resistor R32 as well as an alternating-current voltage component Vo33 between an output terminal P34 of a resistor R34 and the output terminal P33 of the resistor R33 are measured respectively.

Figure 11A:
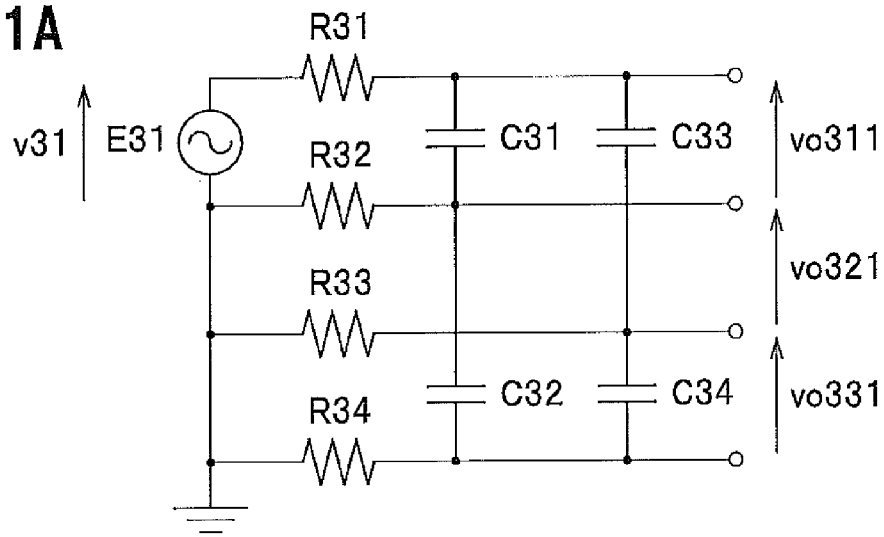
FIGS. 11A to 11C are a circuit diagram to explain the influence of the output voltage of each battery module in the case where three battery modules are provided with respect to the battery module voltage detector of the present invention.

For convenience sake, as shown in FIG. 11A, when the alternating-current voltage components V32 and V33 are equal to zero (V32=V33=0), an alternating-current voltage component Vo311 corresponding to the alternating-current voltage component V31 is described as follows;

$$Vo311=ViZ(3R+Z)/\{(2R+Z)(4R+Z)\} \quad (8)$$

Figure 11B:
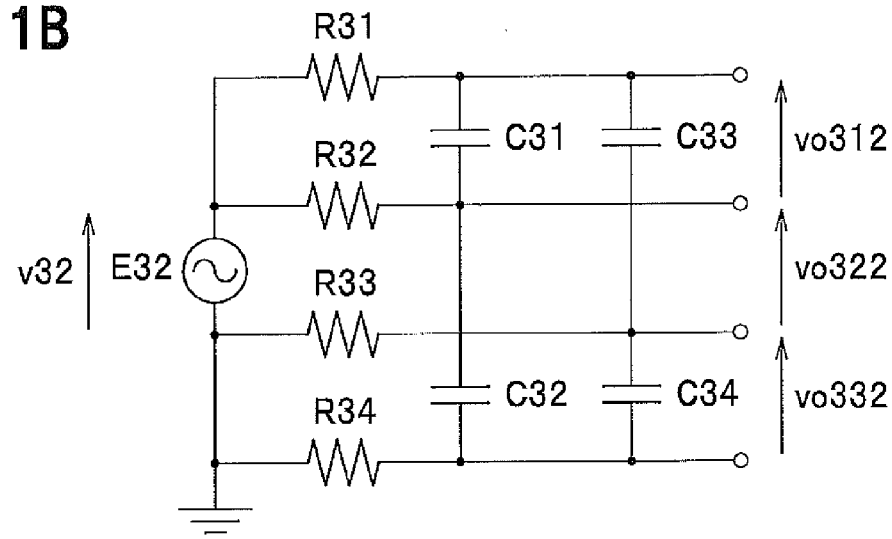

As shown in FIG. 11B, the alternating-current voltage components V31 and V33 are equal to zero (V31=V33=0). As an R31-C33-R33 path is equivalent to an R32-C32-R34 path, there is no electric potential difference across the capacitors C31 and C34 which are respectively disposed between the R32 and R33, and between the R33 and R34. Accordingly, the alternating-current voltage component Vo312 corresponding to the alternating-current voltage component V32 becomes equal to zero (Vo312=0).

Figure 11C:
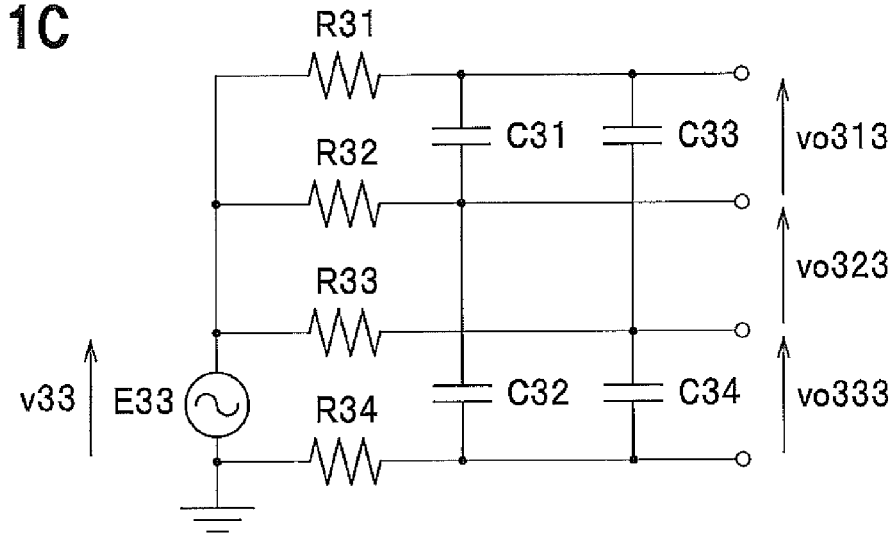

As shown in FIG. 11C, when the alternating-current voltage components V31 and V33 are equal to zero (V31=V33=0), the alternating-current voltage component Vo313 corresponding to the alternating-current voltage component V33 is described as follows;

$$Vo313=ViRZ/\{(2R+Z)(4R+Z)\} \quad (9)$$

When the alternating-current voltage components V31, V32 and V33 are equal to the voltage Vi, the alternating-current voltage component Vo31 is described as follows;

$$Vo31=Vo311+Vo312+Vo313=ViZ/(2R+Z)$$

As the alternating-current voltage component Vo33 is equivalent to the alternating-current voltage component Vo31, the alternating-current voltage component Vo33 is described as follows;

$$Vo33=ViZ/(2R+Z)$$

A voltage VC32 applied to the capacitor C32 needs to be measured in order to determine the value of the alternating-current voltage component Vo32.

As described in the case where the alternating-current voltage component Vo is determined, assuming that each of the voltages V31, V32, and V33 is individually applied, a voltage is generated between the point 31 and the point 32, between the point 32 and the point 33, between the point 33 and the point 34 respectively. Furthermore, when the voltage generated between the point 32 and the point 34 is added, the voltage VC32 is described as follows;

$$VC32 = ViRZ/\{(2R+Z)(4R+Z)\} + \quad (10)$$
$$ViZ/(2R+Z) + ViZ(3R+Z)/\{(2R+Z)(4R+Z)\}$$
$$= Vo31 + ViZ/(2R+Z)$$

Consequently, the alternating-current voltage component Vo32 is described as follows;

$$Vo32=VC32-Vo33=VC32-Vo31=ViZ/(2R+Z)$$

Accordingly, since the alternating-current voltage components Vo31, Vo32 and Vo33 are equal to equation (4), each of the filters in FIG. 11C has an equivalent frequency response of one filter where one battery module is provided.

Figure 12A:
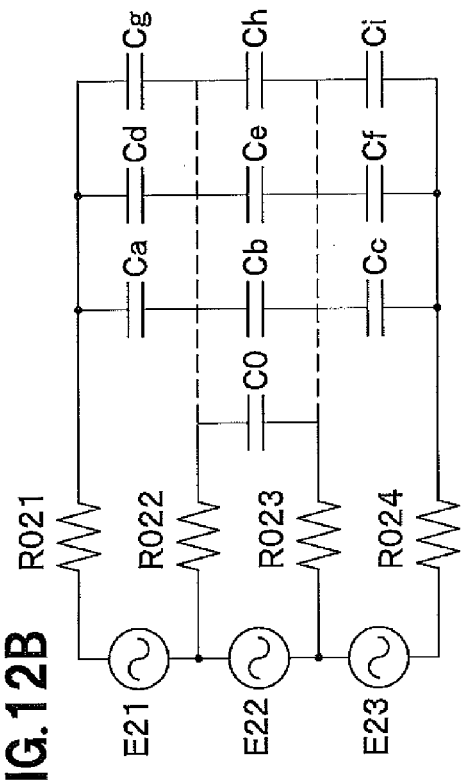
FIGS. 12A to 12D are a circuit diagram to explain the replacement of capacitors in an equivalent circuit where three battery modules are provided.
Figure 12B:
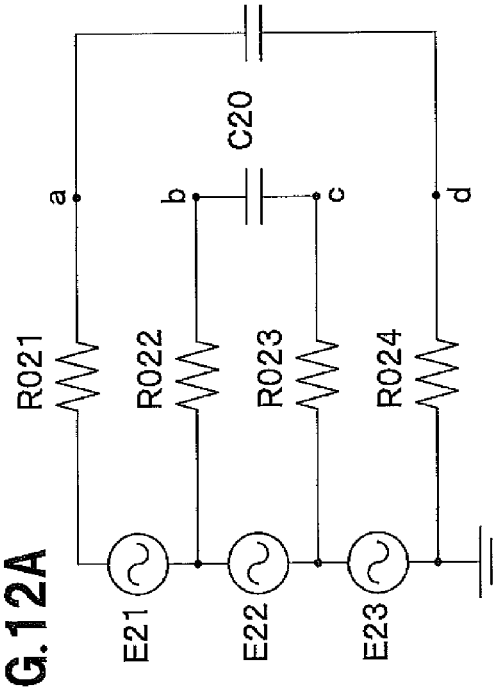

According to FIGS. 12A to 12D, the circuit of FIG. 4A is equivalent to the circuit of FIG. 10. FIG. 12A shows the same circuit of FIG. 4A. An alternating-current power supply E22 is connected in series to resistors R022 and R023 and a capacitor C20. An alternating-current power supply E21 is connected in series to resistors R021 and 8024 and a capacitor C300. The capacitor 300 is equivalent to a circuit wherein three pairs of capacitors connected in series are connected in parallel, and each of the capacitors has the equal capacitance C0. The capacitor C300 can be replaced with 9 capacitors Ca, Cb, Cc, Cd, Ce, Cf, Cg, Ch, and Cg (FIG. 12B).

Figure 12C:
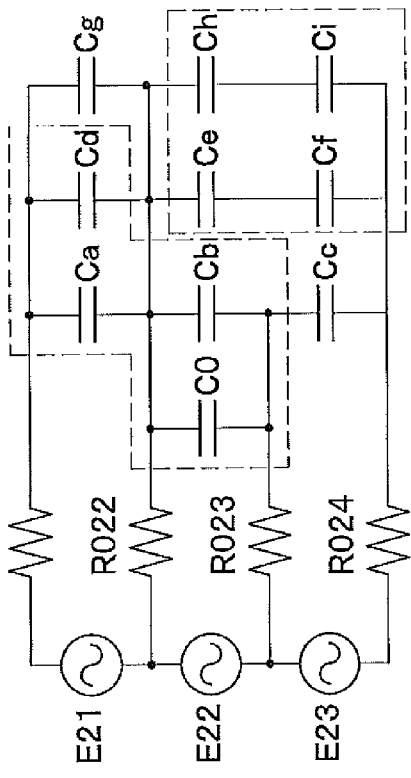

As explained that the frequency characteristics of the capacitors C21, C22, and C23 are equal with reference to FIGS. 4A and 4C, the frequency characteristics between points A and B, between points B and C, and between points C and D in FIG. 12B are respectively equal. Accordingly, as shown in FIG. 12C, connecting points, between the resistor R022 and the capacitor C0, between the capacitors Ca and Cb, between the capacitors Cd and Ce, between the capacitors Cg and Ch, can be connected. Furthermore, connecting points, between the resistor R023 and the capacitor C0, and between the capacitors Cb and Cc, can be connected.

Figure 12D:
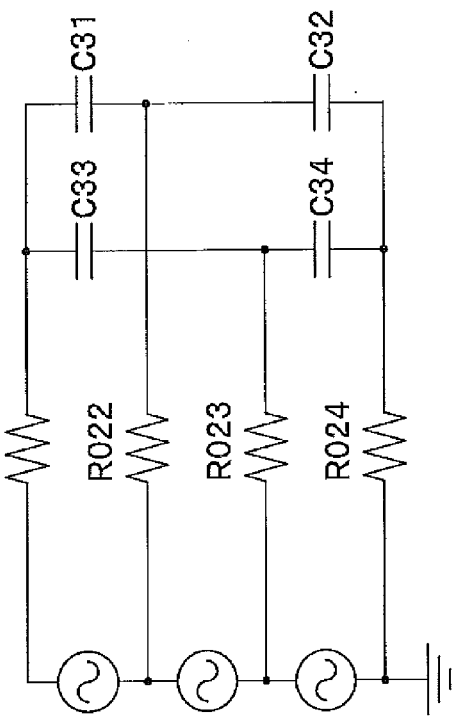

The capacitors C0, Ca, Cb, and Cd are equivalent to a circuit wherein a pair of capacitors connected in series are connected in parallel, and each of the capacitors has the equal capacitance value C0. Accordingly, the capacitors C0, Ca, Cb, and Cd are equivalent to a capacitor C33 having the capacitance C0. The capacitors Ce, Cf, Ch, and Ci are equivalent to a capacitor C32 having the capacitance value C0 (FIG. 12D). Consequently, the circuit of FIG. 4A is equivalent to the circuit of FIG. 10.

Extensive explanation of the embodiment will be described with reference to FIGS. 13 to 16.

Figure 13:
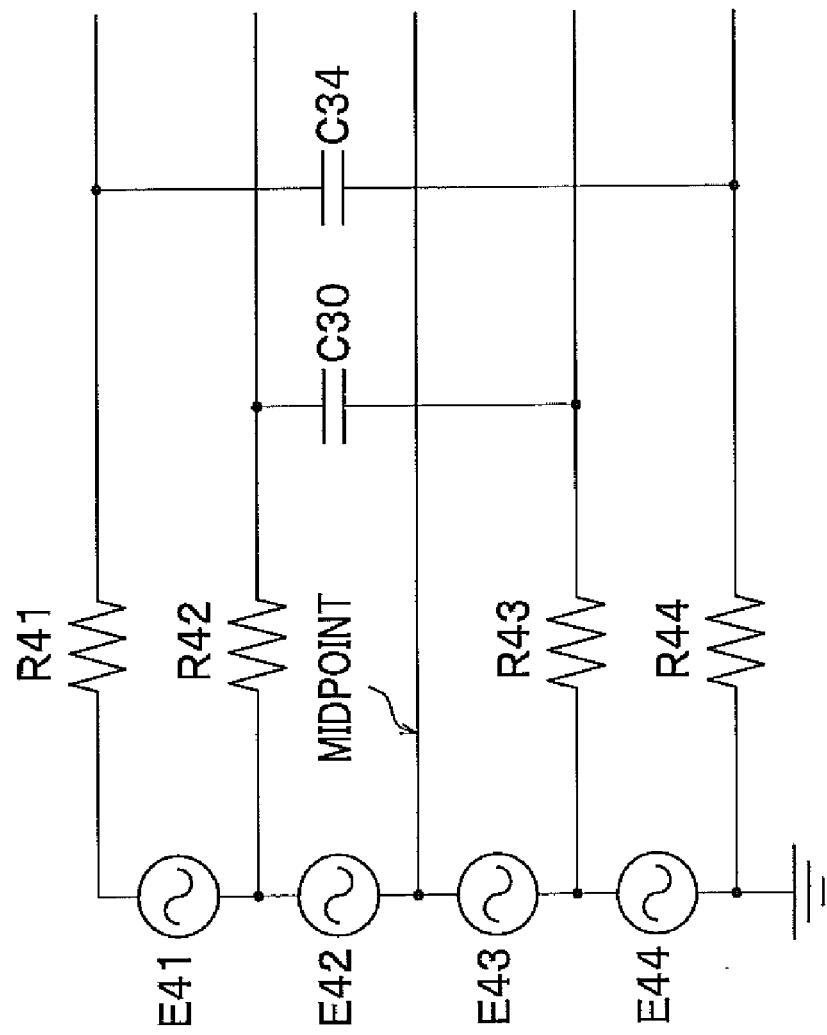
FIG. 13 is a circuit diagram of the voltage detecting device where four battery modules are provided.

In FIG. 13, four battery modules E41, E42, E43, and E44 are connected in series. A series circuit where the resistors R53 and R54 and a capacitor 35 are connected in series is connected to one end of the battery modules E41 and E44. A series circuit where the resistors R42 and R43 and a capacitor 30 are connected in series is connected to one end of the battery modules E42 and E43, which are connected in series. If the number of battery modules is an even number, a capacitor is not connected at a midpoint between the battery modules E42 and E43. Accordingly, the presence of a resistor at the midpoint does not affect the frequency characteristics.

Figure 14A:
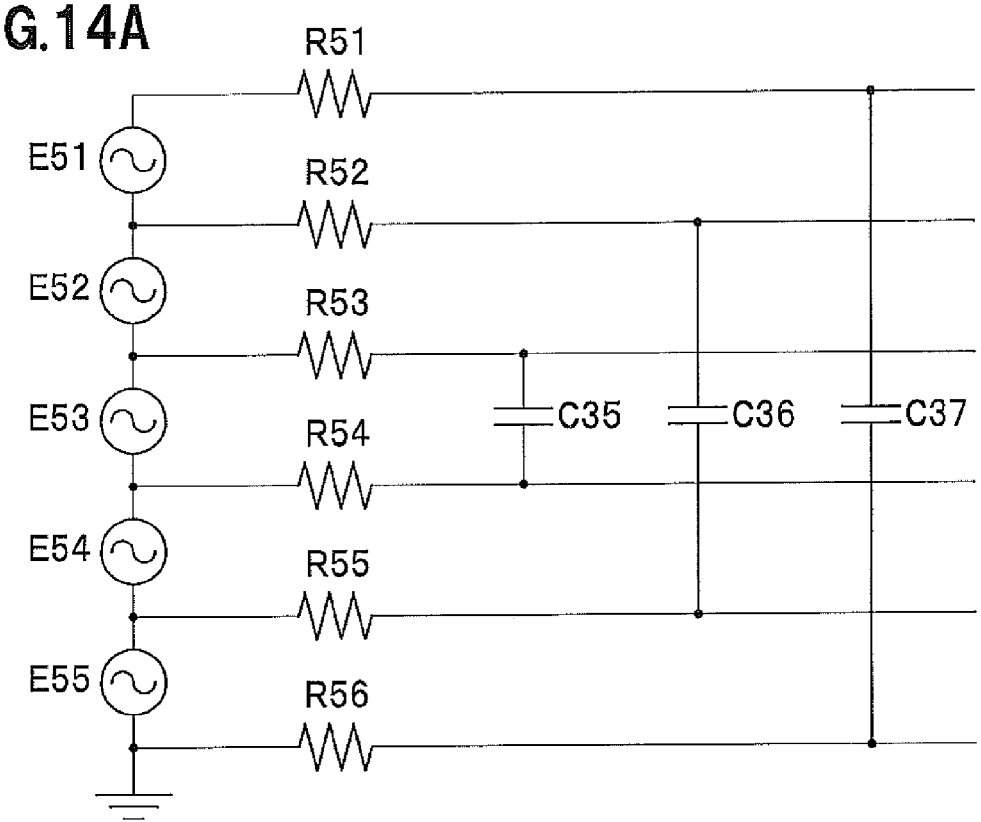
FIGS. 14A and 14B are a circuit diagram to explain the replacement of capacitors in an equivalent circuit where five battery modules are provided.
Figure 14B:
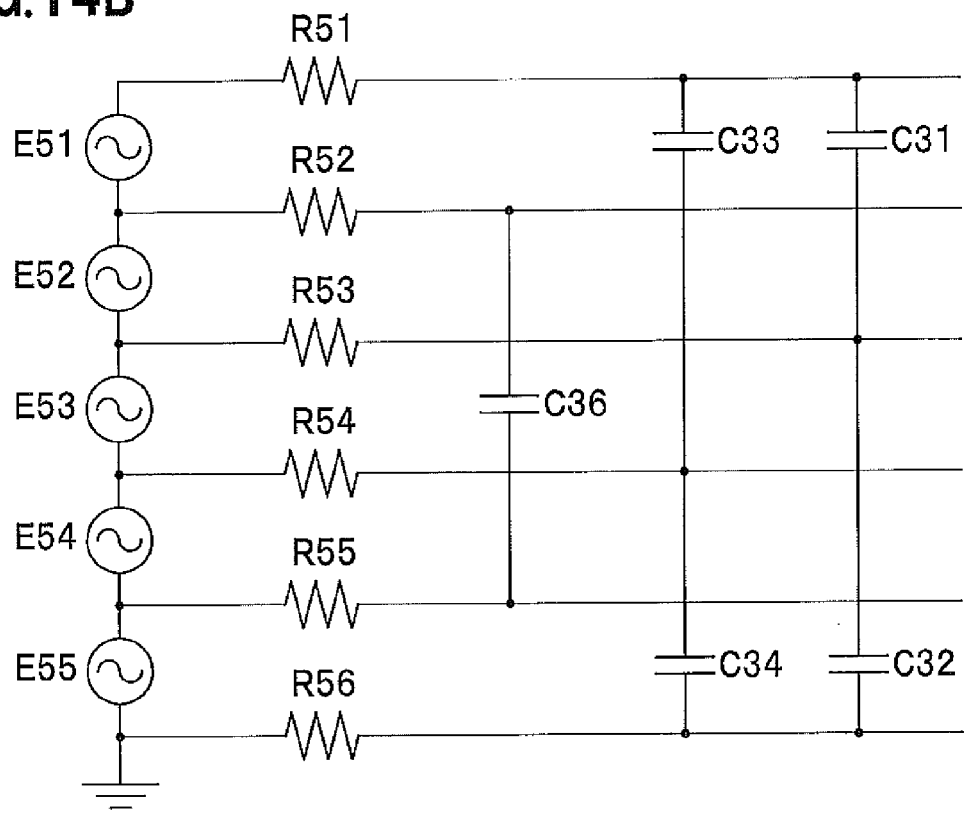

In FIGS. 14A and 14B, five battery modules E51, E52, E53, E54, and E55 are connected in series. In FIG. 14A, the battery is module E53 is connected to a series circuit in which resistors R53 and R54 and a capacitor C35 are connected in series. The battery modules E52, E53 and E54 connected in series are connected to a series circuit in which resistor R52 and R55 and a capacitor C36 are connected in series. The battery modules E51, E52, E53, E54 and E55 connected in series are connected to a series circuit in which the resistors R51 and R56 and a capacitor C37 are connected in series.

FIG. 14B is equivalent to FIG. 14A. As explained as for FIG. 12, the capacitors C35 and C37 can be replaced with the capacitors C31, C32, C33, and C34. Accordingly, a voltage applied to the capacitors C32 and C33 is reduced to three-fifths of the voltage applied to the capacitor C37. According to this replacement of the capacitors C36 and C37, FIG. 14B becomes equal in structure to FIG. 18.

Figure 15B:
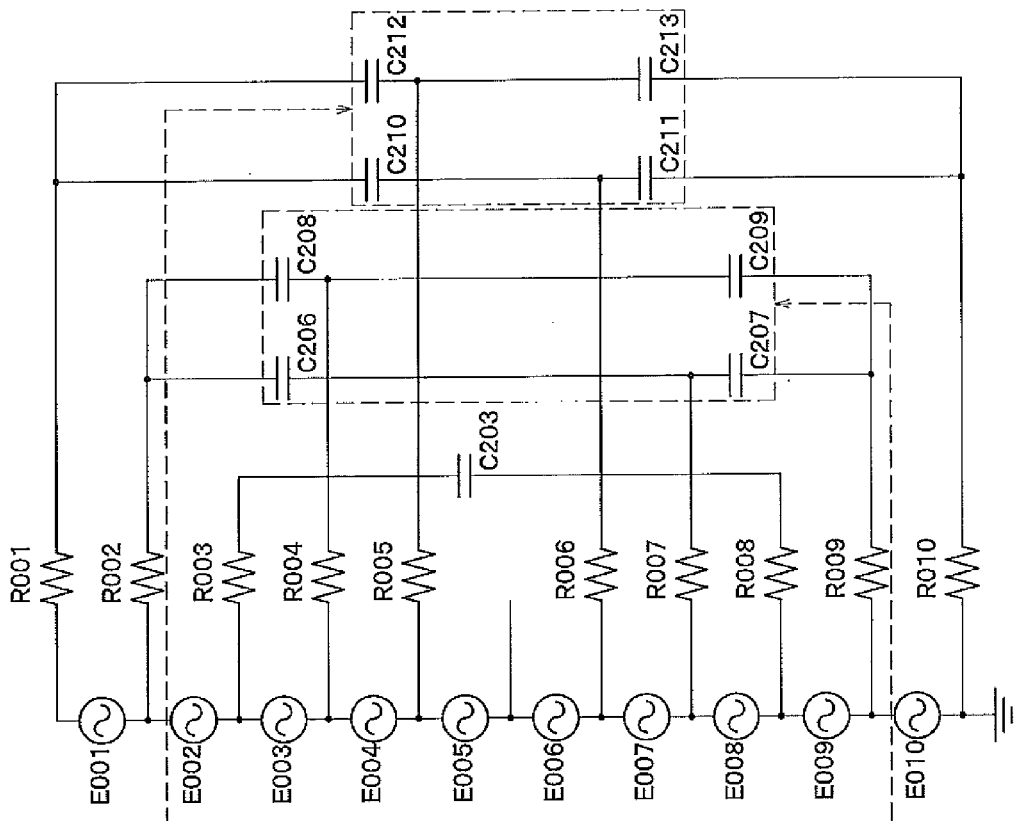
FIGS. 15A and 15B are a circuit diagram to explain the replacement of capacitors in an equivalent circuit where ten battery modules are provided.
Figure 15A:
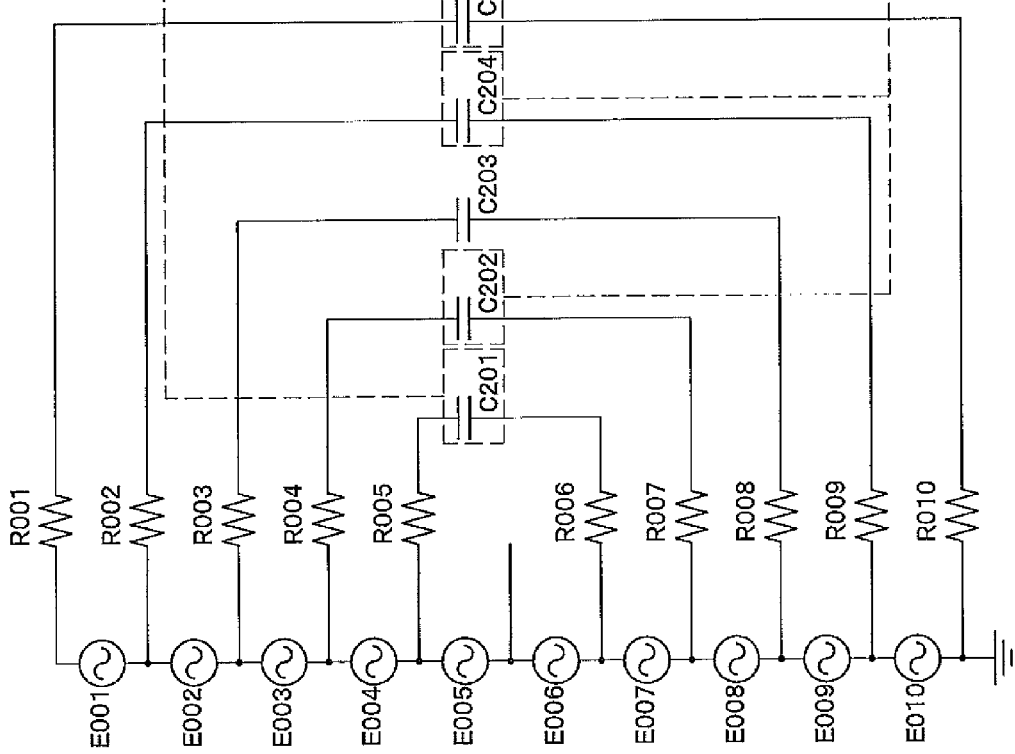

In FIG. 15, ten battery modules E001 to E010 are connected in series. In FIG. 15A, the battery modules E005 and E006 connected in series are connected to a series circuit in which resistors R005 and R006 and a capacitor C201 are connected in series. The battery modules E004 to E007 connected in series are connected to a series circuit in which resistors R004 and R007 and a capacitor 202 are connected in series. The battery modules E003 to E008 connected in series are connected to a series circuit in which resistors R003 and R008 and a capacitor 203 are connected in series. The battery modules E002 to E009 connected in series are connected to a series circuit in which resistors R002 and R009 and a capacitor C204 are connected in series. The modules E001 to E010 are connected to a series circuit in which resistors R001 and R010 and a capacitor C205 are connected in series.

In FIG. 15B, as explained as for the replacement of the capacitors in FIG. 12, the capacitors C202 and C204 can be replaced with the capacitors C206 to C209, and the capacitors C201 and C205 can be replaced with the capacitors C210 to C213.

In other words, the battery modules E002 to E009 are connected to a series circuit in which the capacitors C206 and C207 are connected in series, and a series circuit in which the capacitors C208 and C209 are connected in series. A connecting point between the capacitors C206 and C207 is connected to a point between the battery modules E007 and E008 via a resistor R007. A connecting point between the capacitors C208 and C209 is connected to a connecting point between the battery modules E003 and E004 via a resistor R004.

Further, the battery modules E001 to E010 are connected to a series circuit in which the capacitors C210 and C211 are connected in series, and a series circuit in which the capacitors C212 and C211 are connected in series. A connecting point between the capacitor C210 and C213 is connected to a connecting point between the battery modules E006 and E007 via a resistor R006. A connecting point between the capacitors C212 and C213 is connected to a connecting point between the battery modules E004 and E005 via a resistor R005. As is the case with FIG. 15A, the battery modules E003 to E008 are connected to a series circuit in which resistors R003 and R008 and a capacitor C203 are connected in series. In the circuit of FIG. 15B, a voltage applied to the capacitors C210 and C213 is reduced to six-tenths of the voltage applied to the capacitor C205 of FIG. 15A, and a voltage applied to the capacitors C206 and C209 is reduced to six-eighths of the voltage applied to the capacitor C204 of FIG. 15A.

Figure 16A:
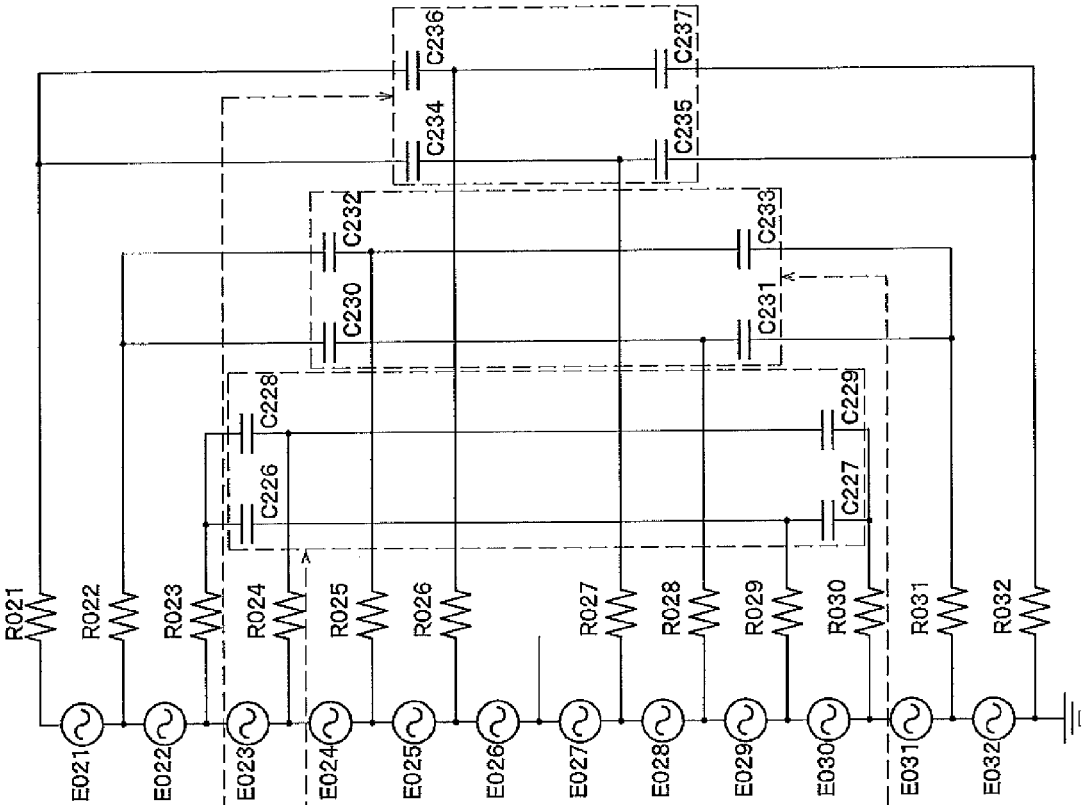
FIGS. 16A and 16B are a circuit diagram to explain the replacement of capacitors in an equivalent circuit where twelve battery modules are provided.

In FIG. 16, twelve battery modules E021 to E032 are connected in series. In FIG. 16A, the battery modules E026 and E027 are connected to a series circuit in which resistor R026 and R027 and a capacitor C220 are connected in series. The battery modules E025 to E028 are connected to a series circuit in which resistors R025 and R028 and a capacitor C221 are connected in series. The battery modules E024 to E029 are connected to a series circuit in which resistors R024 and R029 and a capacitor C222 are connected in series. The battery modules E023 and E030 are connected to a series circuit in which resistors R023 and R030 and a capacitor C223 are connected in series. The battery modules E022 to E031 are connected to a series circuit in which resistors R022 and R031 and a capacitor C224 are connected in series. The battery modules E021 and E032 are connected to a series circuit in which resistors R021 and R032 and a capacitor C225 are connected in series. As is the case with FIG. 12, the capacitors C220 and C225 can be replaced with the capacitors C234, C235, C236, and C237, the capacitors C221 and C224 can be replaced with the capacitors C230, C231, C232, and C233, and the capacitors C222 and 0223 can be replaced with the capacitors C226, C227, C228, and C229.

Figure 16B:
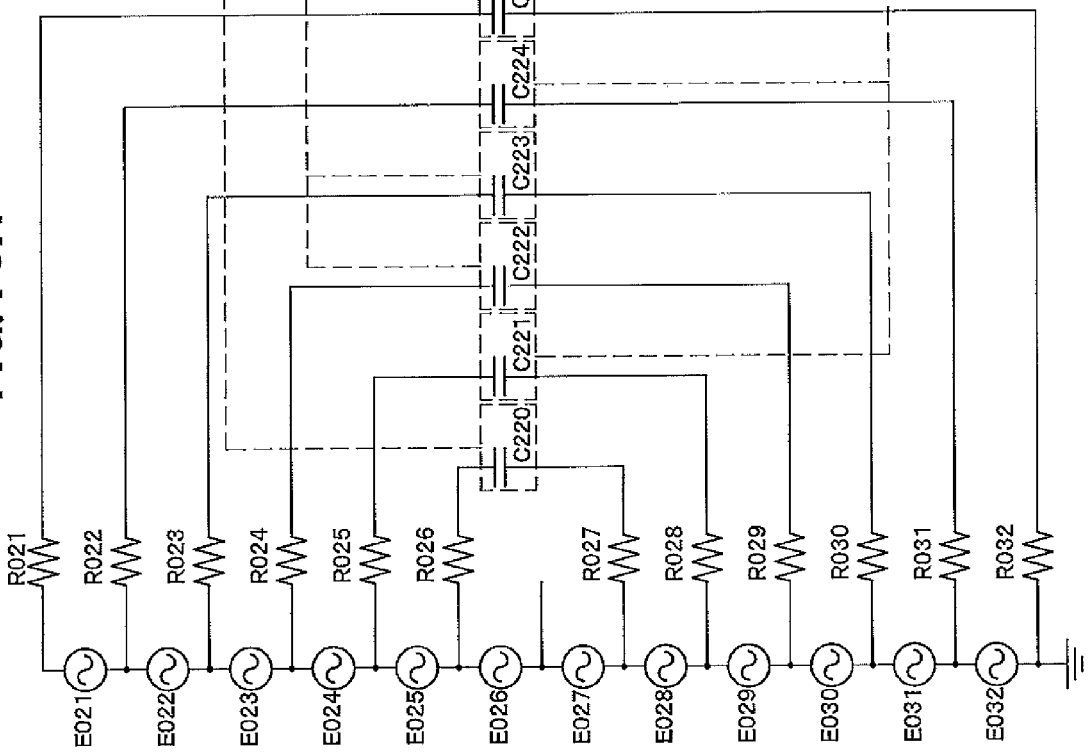

Consequently, in FIG. 16B, the battery modules E023 to E030 are connected via resistors R023 and R030 to a series circuit in which the capacitors C226 and C227 are connected in series, and a series circuit in which the capacitors C228 and C229 are connected in series. A connecting point between the capacitors C230 and C227 is connected via a resistor R029 to a connecting point between the battery modules E228 and E030. A connecting point between the capacitors C228 and C229 is connected via a resistor R024 to a connecting point between the battery modules E023 and E024.

The battery modules E022 and E031 are connected via resistors R022 and R031 to a series circuit in which the capacitors C230 and C231 are connected in series, and a series circuit in which the capacitors C232 and C233 are connected in series. A connecting point between the capacitors C230 and C231 is connected via a resistor R028 to a connecting point between the battery modules E028 and E029. A connecting point between the capacitors C232 and C233 is connected via a resistor R025 to a connecting point between the battery modules E024 and E025.

The battery modules E021 and E032 are connected via resistors R021 and R032 to a series circuit in which the capacitors C236 and C237 are connected in series, and a series circuit in which the capacitors C236 and C237 are connected in series. A connecting point between the capacitors C234 and C235 is connected via a resistor R027 to a connecting point between the battery modules E027 and E028. A connecting point between the capacitors C236 and C237 is connected via a resistor R026 to a connecting point between the battery modules E025 and E026.

Figure 17:
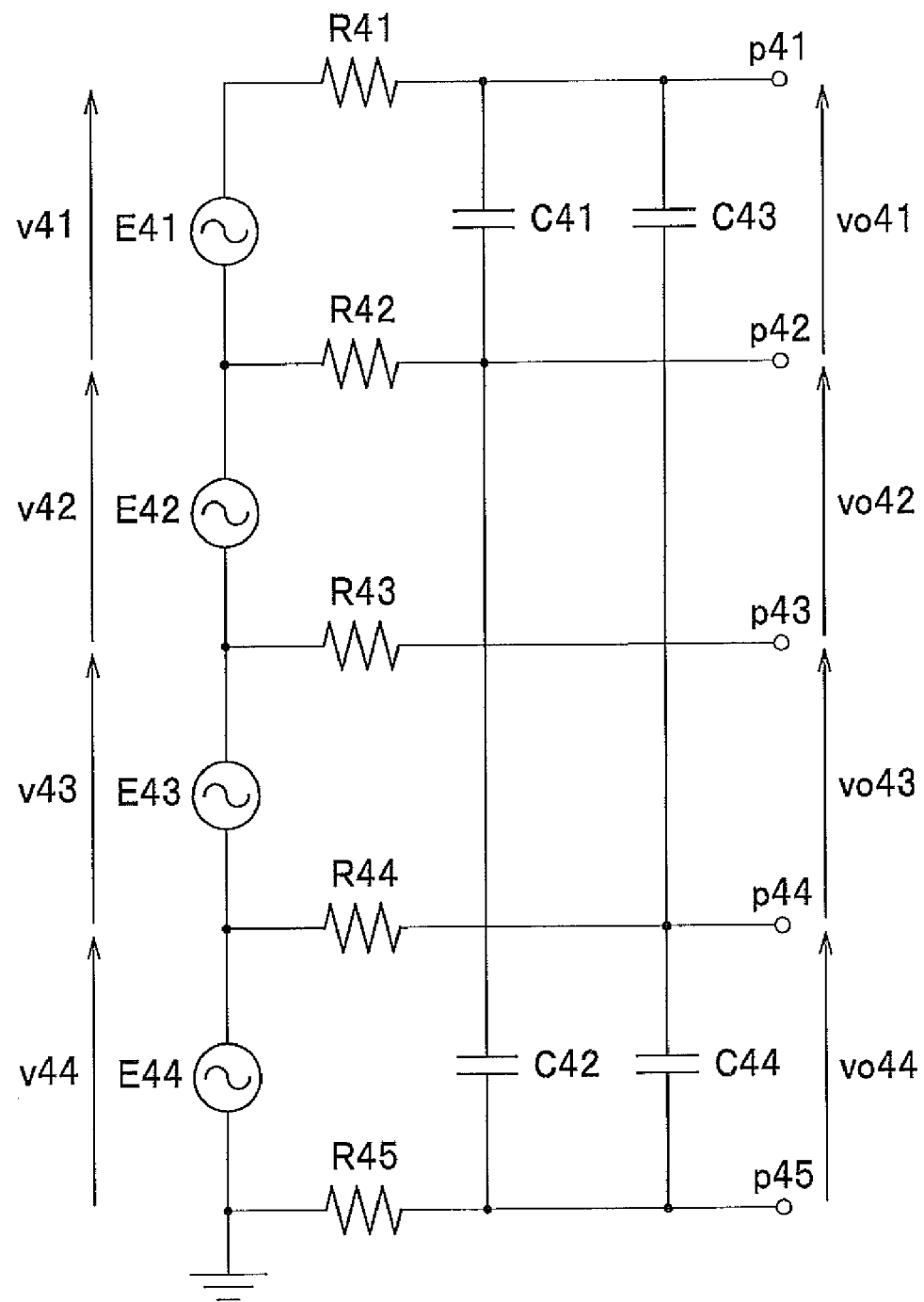
FIG. 17 is a circuit diagram of the voltage detecting device where four battery modules are provided with respect to the battery module voltage detector of the present invention.

FIG. 17 shows the case where four battery modules are provided, apart from the circuit of FIG. 13.

In FIG. 17, a resistance value of resistors R41 to R44 is "R", capacitance of capacitors C41 to C44 is "C0", impedance of the capacitors C41 to C44 is "Z". Battery modules E41 and E44 are called as an end battery module, the capacitors C41 and C44 are called as an end capacitor, the capacitor C42 is called as a negative-side peripheral capacitor, and the capacitor C43 is called as a positive-side peripheral capacitor.

Alternating-current voltage components V41 to V44 of battery modules E41 to E44 are equal to the voltage Vi (V41=V42=V43=V44=Vi). As is the case with alternating-current voltage component Vo33, where the three battery modules are provided, alternating-current voltage components Vo41, Vo42, Vo43, and Vo44 are described as follows;

$Vo41=ViZ/(2R+Z)$

The alternating-current voltage component Vo44 is equivalent to the alternating-current voltage component Vo41. Accordingly, the alternating-current voltage component Vo44 is described as follows;

$Vo44=ViZ/(2R+Z)$

When the voltages Vi of the battery modules E42 and E43 are added, the sum is twice as much as the voltage Vi. Accordingly, the sum is equal to the total voltage (Vo42+Vo43) of the alternating-current voltage components Vo42 and Vo43. Accordingly, the total voltage (Vo42+Vo43) is described as follows;

$Vo42+Vo43=2ViZ/(2R+Z)$

As the alternating-current voltage component Vo42 is equal to the alternating-current voltage component Vo43, the alternating-current voltage components Vo42 and Vo43 are described as follows;

$Vo42=Vo43=ViZ/(2R+Z)$

Accordingly, each of four filters, corresponding the alternating-current voltage components Vo41 to Vo44, has an equivalent frequency response of the filter where one battery module is provided. Since the resistance value of a resistor R43 does not affect the frequency response, the resistor R43 can be of an arbitrary resistance value.

Figure 18:
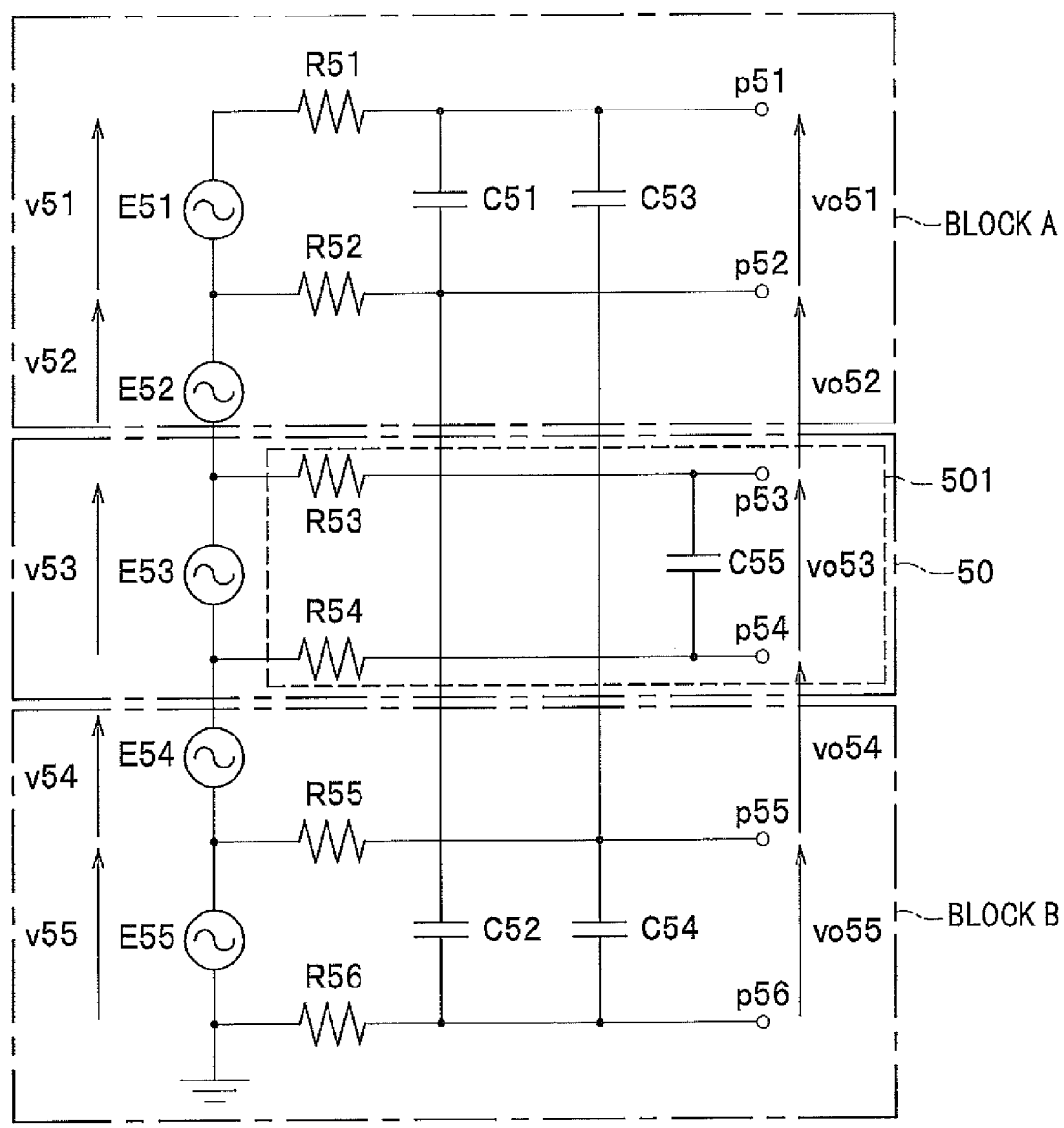
FIG. 18 is a circuit diagram of the voltage detecting device where five battery modules are provided with respect to the battery module voltage detector of the present invention.

FIG. 18 shows the case where five battery modules are provided, apart from the circuit of FIG. 14.

In FIG. 18, a resistance value of resistors R51 to R56 is "R", capacitance of capacitors C51 to C55 is "C0", impedance of the capacitors C51 to C55 is "Z". Alternating-current voltage components V51 to V55 of battery modules E51 to E55 are equal to the voltage Vi (V51=V52=V53=V44=V55=Vi).

As is the case where the three battery modules are provided, alternating-current voltage components Vo51, Vo52, Vo53, Vo54 and Vo55 are described as follows;

$$Vo51 = ViZ/(2R+Z)$$

The alternating-current voltage component Vo55 is equivalent to the alternating-current voltage component Vo51. Accordingly, the alternating-current voltage component Vo55 is described as follows;

$$Vo55 = ViZ/(2R+Z)$$

When the voltages Vi of the battery modules E52, E53, and E54 are added, the sum is three times as much as the voltage Vi. Accordingly, the sum is equal to the total voltage (Vo52+Vo53+Vo54) of the alternating-current voltage components Vo52, Vo53, and Vo54.

Accordingly, the total voltage (Vo52+Vo53+Vo54) is described as follows;

$$Vo52+Vo53+Vo54 = 3ViZ/(2R+Z)$$

Figure 8:
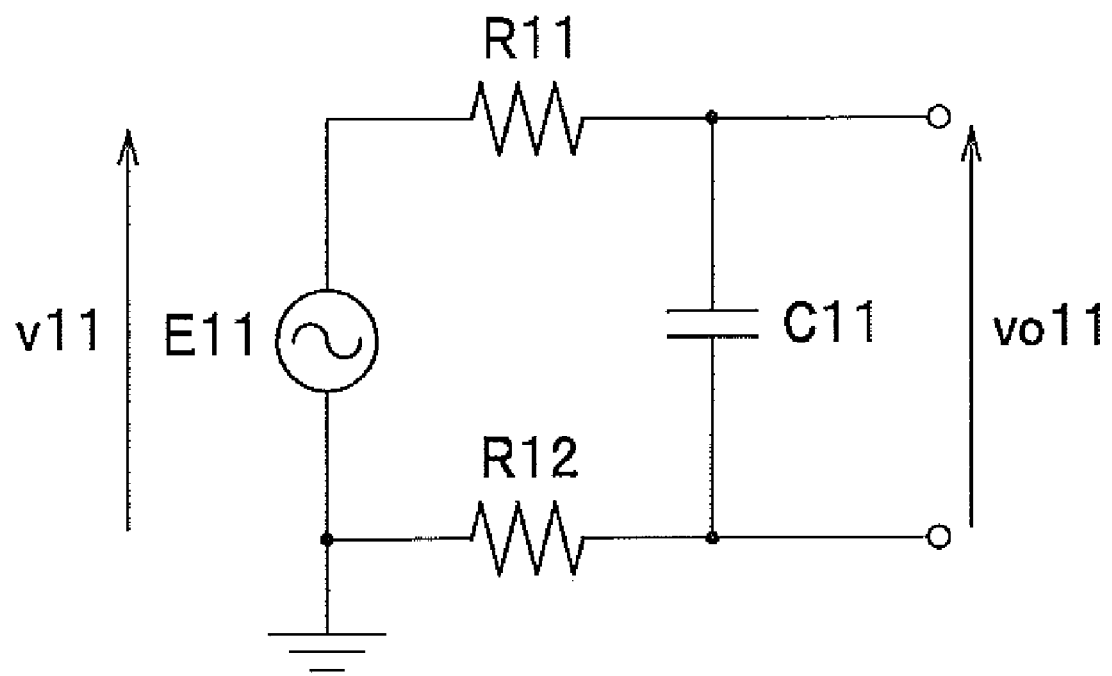
FIG. 8 is a circuit diagram of the voltage detecting device where one battery module is provided with respect to the battery module voltage detector of the present invention.

A one-battery-module-type battery unit 50 which generates the alternating-current voltage component Vo53 is identical with a circuit which includes a set of the battery module equivalent to that of FIG. 8 and the one-battery-module filter block 501 being the anti-aliasing filter. The one-battery-module filter block 501 is only connected to the battery module E53. Accordingly, the one-battery-module-type battery unit 50 can be regarded as an independent circuit. The alternating-current voltage component Vo53 is described as follows;

$$Vo53 = ViZ/(2R+Z)$$

Since the alternating-current voltage component Vo52 is equal to the alternating-current voltage component Vo54, the alternating-current voltage components Vo52 and Vo54 are respectively described as follows;

$$\{3ViZ/(2R+Z) - Vo53\}/2 = Vo52 = Vo54 = ViZ/(2R+Z)$$

Accordingly, each of five filters, corresponding to alternating-current voltage components Vo51 to Vo55, has an equivalent frequency response of the filter where one battery module is provided.

Viewed from another angle, the circuit of FIG. 18 is identical with the circuit of FIG. 17 which includes the four battery modules and four filters when the resistor R43 (FIG. 17) connected to the center of the battery pack 11 (FIG. 7) is replaced with the one-battery module-type battery unit 50 (FIG. 18). A circuit structure (FIG. 18) where blocks A and B are connected is identical with that of the four battery modules (FIG. 17).

As previously described above, in FIG. 17, the resistance value of the resistor R43 does not affect the frequency response of the filter. As described in this paragraph, when the resistor R43 is replaced with the independent circuit including the battery module and one filter, the frequency response of the other filters is not influenced.

Figure 19:
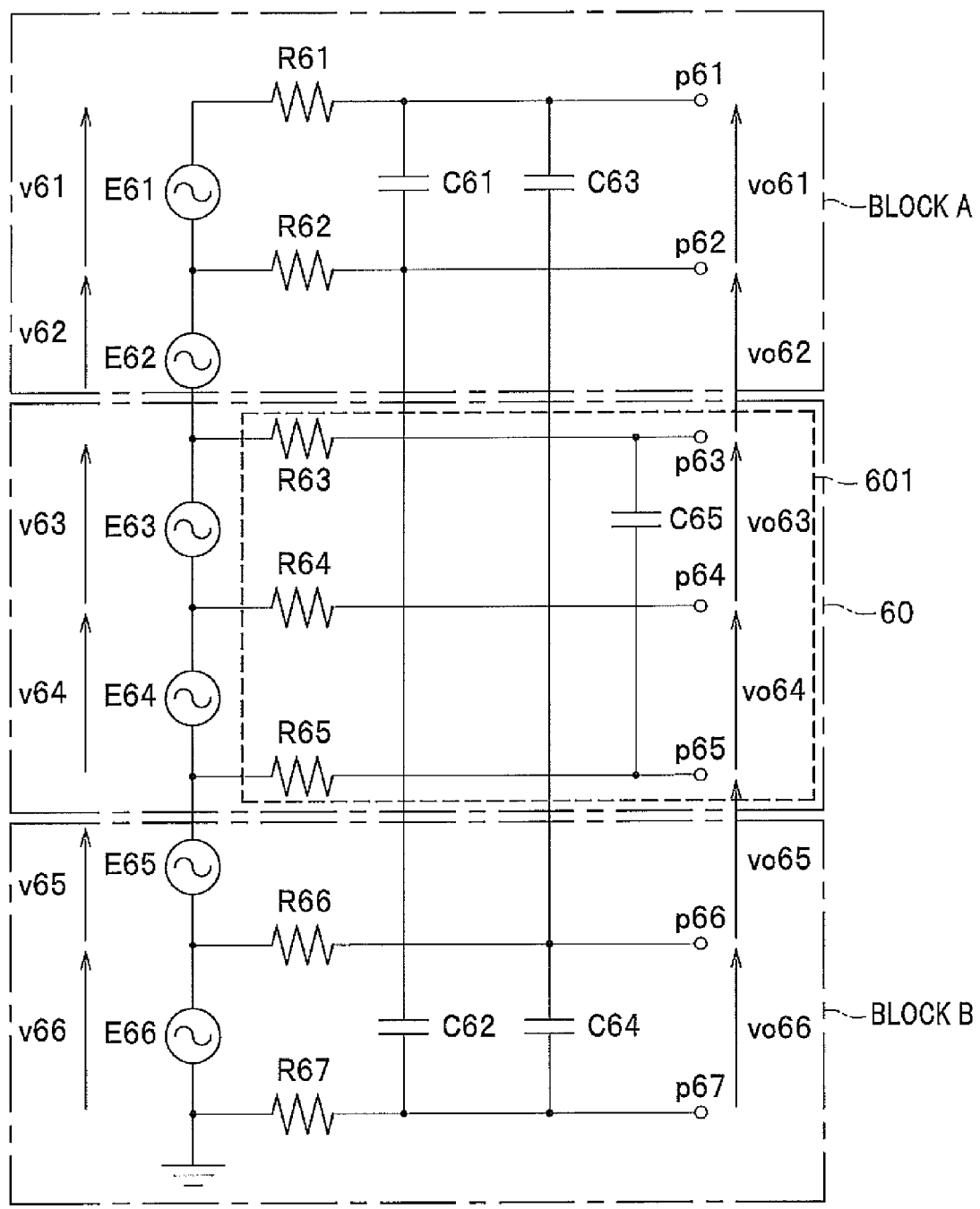
FIG. 19 is a circuit diagram of the voltage detecting device where six battery modules are provided with respect to the battery module voltage detector of the present invention.

FIG. 19 shows the case where six battery modules are provided.

In FIG. 19, a resistance value of resistors R61 to R67 is "R", a capacitance value of capacitors C61 to C65 is "C0", impedance of the capacitors C61 to C65 is "Z". Alternating-current voltage components V61 to V66 of battery modules E61 to E66 are equal to the voltage Vi (V61=V62=V63=V64=V65=V66=Vi).

As is the case where the three battery modules are provided, alternating-current voltage components Vo61, Vo62, Vo63, Vo64, Vo65 and Vo66 are described as follows;

$$Vo61 = ViZ/(2R+Z)$$

The alternating-current voltage component Vo66 is equivalent to the alternating-current voltage component Vo61. Accordingly, the alternating-current voltage component Vo66 is described as follows;

$$Vo66 = ViZ/(2R+Z)$$

When the voltages Vi of the battery modules E62, E63, E64, and E66 are added, the sum is four times as much as the voltage Vi. Accordingly, the sum is equal to the total voltage (Vo62+Vo63+Vo64+Vo65) of the alternating-current voltage components Vo62, Vo63, Vo64, and Vo65.

Accordingly, the total voltage (Vo62+Vo63+Vo64+Vo65) is described as follows;

$$Vo62+Vo63+Vo64+Vo65 = 4ViZ/(2R+Z)$$

On the other hand, a two-battery-module-type battery unit 60 is identical with a circuit which includes two battery modules shown in FIG. 19 and the two-battery-module filter block 601 being the anti-aliasing filter. Accordingly, the two-battery-module-type battery unit 60 can be regarded as an independent circuit which can provide the alternating-current voltage components Vo63 and Vo64. The sum (Vo63+Vo64) of alternating-current voltage components Vo63 and Vo64 is described as follows;

$$Vo63+Vo64 = 2ViZ/(2R+Z)$$

As the alternating-current voltage component Vo63 is equal to the alternating-current voltage component Vo64, the alternating-current voltage component Vo63 is described as follows;

$$Vo63 = Vo64 = ViZ/(2R+Z)$$

As the alternating-current voltage component Vo62 is equal to the alternating-current voltage component Vo65, the alternating-current voltage component Vo62 is described as follows;

$$\{4ViZ/(2R+Z) - Vo63 - Vo64\}/2 = Vo62 = Vo65 = ViZ/(2R+Z)$$

Accordingly, each of six filters, corresponding to the alternating-current voltage components Vo61 to Vo66, has an equivalent frequency response of the filter where one battery module is provided.

Viewed from another angle, the circuit of FIG. 19 is identical with the circuit of FIG. 17 which includes the four battery modules and four filters when the resistor R43 (FIG. 17) connected to the center of the battery pack 11 is replaced with the two-battery module-type battery unit 60 (FIG. 18) including two battery modules and two-battery-module filter block 601.

As previously described, when the resistor R43 is replaced with the independent circuit including the battery module and two filters, the frequency response of the other filters is not influenced.

Since the resistance value of a resistor R43 does not affect the frequency response of the other filters, the resistor R43 can be of an arbitrary resistance value.

Next shows the case where seven battery modules are provided.

Figure 20:
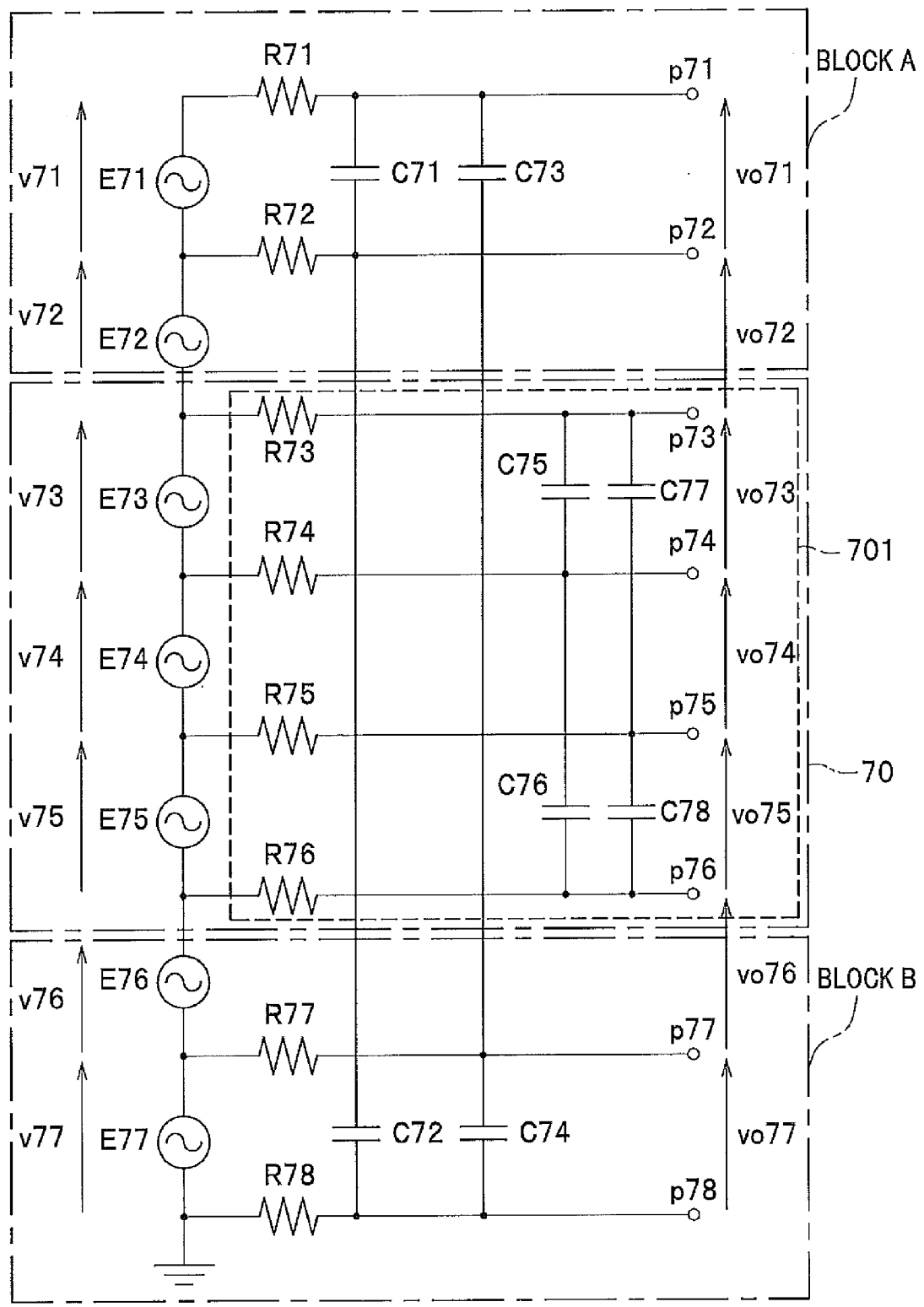
FIG. 20 is a circuit diagram of the voltage detecting device where seven battery modules are provided with respect to the battery module voltage detector of the present invention.

In FIG. 20, a resistance value of resistors R71 to R78 is "R", a capacitance value of capacitors C71 to C78 is "C0", impedance of the capacitors C71 to C78 is "Z". Alternating-current voltage components V71 to V77 of battery modules E71 to E77 are equal to the voltage Vi (V71=V72=V73=V74=V75=V76=V77=Vi), so that alternating-current voltage components Vo71 to Vo77 can be determined.

A three-battery-module-type battery unit 70 which generates the alternating-current voltage components Vo73, Vo74, and Vo75 is identical with a circuit which includes three battery modules shown in FIG. 10. Accordingly, the three-battery-module-type battery unit 70 can be regarded as an independent circuit. As is the case where six battery modules are provided, the alternating-current voltage components Vo71, Vo72, Vo76, and Vo77 can be determined as follows;

$$Vo71=Vo72=Vo73=Vo74=Vo75=Vo76=Vo77=ViZ/(2R+Z)$$

Since the equation above is equal to the equation (1), each of seven filters in FIG. 20 has an equivalent frequency response of the filter where one battery module is provided.

Viewed from another angle, the circuit of FIG. 20 is identical with the circuit of FIG. 17 which includes the four battery modules and four filters when the resistor R43 (FIG. 17) connected to the center of the battery pack 11 is replaced with the three-battery module-type battery unit 70 (FIG. 20) including three battery modules and a three-battery-module filter block 701 being the anti-aliasing filter.

As previously described, when the resistor R43 is replaced with the independent circuit including the three battery modules and three filters, the frequency response of the other filters is not influenced.

Will be described the case where eight battery modules are provided.

Figure 21:
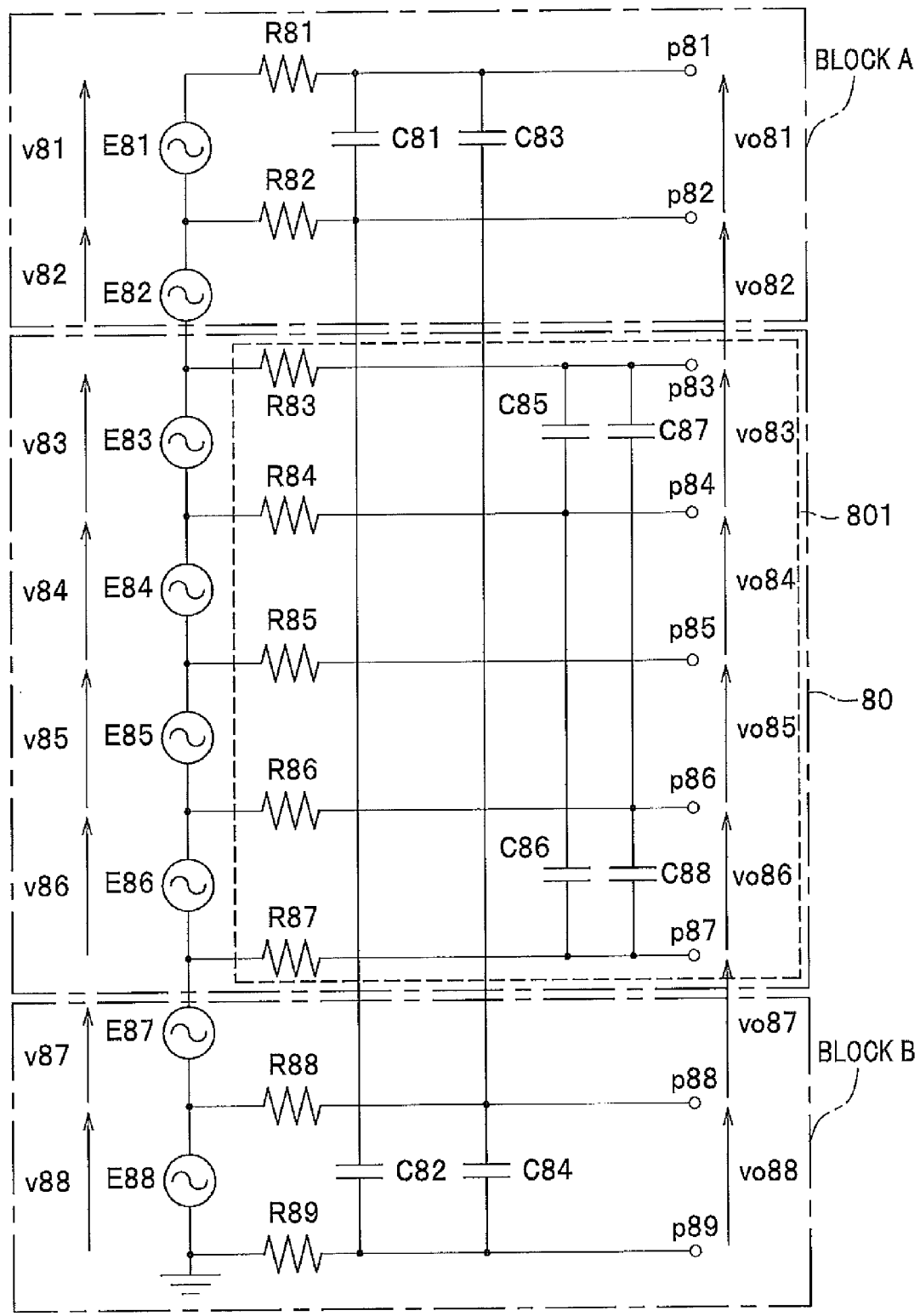
FIG. 21 is a circuit diagram of the voltage detecting device where eight battery modules are provided with respect to the battery module voltage detector of the present invention.

The circuit of FIG. 21 is identical with the circuit of FIG. 17 which includes the four battery modules and four filters when the resistor R43 (FIG. 17) connected to the center of the battery pack 11 is replaced with an independent four-battery module-type battery unit 80 including four battery modules and a four-battery-module filter block 801 being the anti-aliasing filter.

As is the case where four sets of the battery modules are provided, alternating-current voltage components Vo81 to Vo88 can be determined as follows;

$$Vo81=Vo82=Vo83=Vo84=Vo85=Vo86=Vo87=Vo88=ViZ/(2R+Z)$$

Each of eight filters in FIG. 21 has an equivalent frequency response of the filter where one battery module is provided.

Figure 22B:
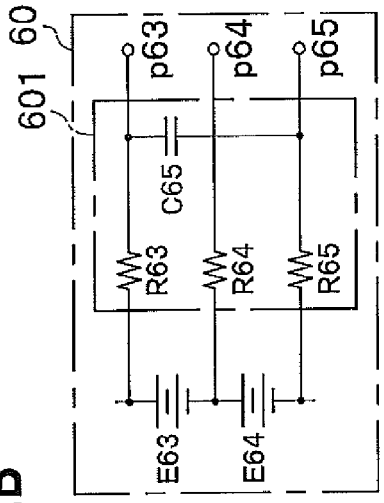
FIGS. 22A to 22D are circuit diagrams of battery-module-type battery units of the battery module voltage detector of the present invention.
Figure 22D:
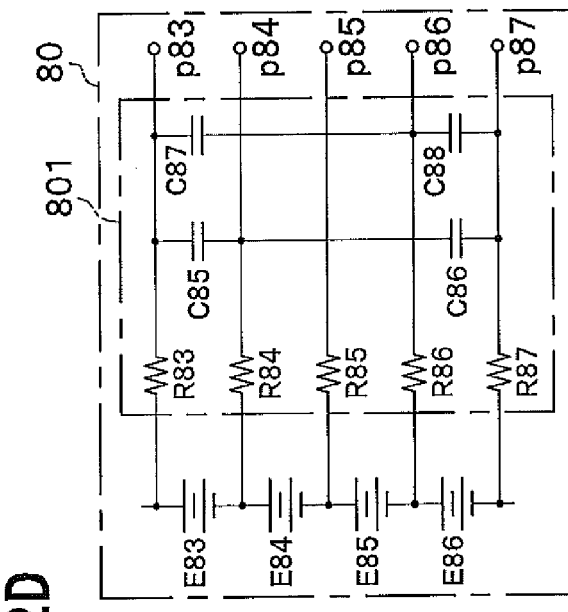
Figure 22A:
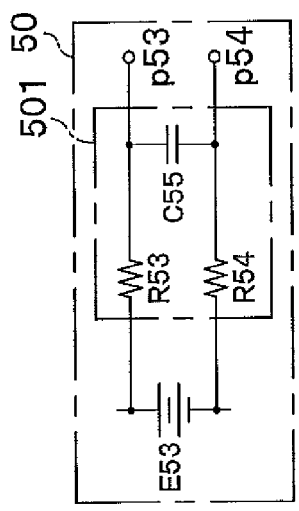
Figure 22C:
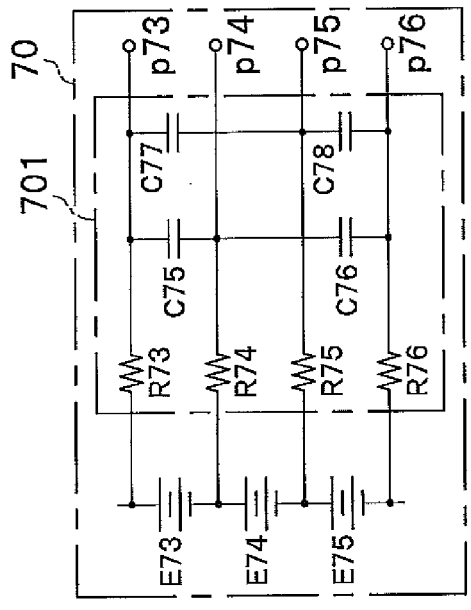

In the case where nine battery modules or more are provided, one-battery-module-type battery unit 50 of FIG. 22A, two-battery-module-type battery unit 60 of FIG. 22B, three-battery-module-type battery unit 70 of FIG. 22C, four-battery-module-type battery-module 80 of FIG. 22D are sequentially disposed in the position of the resistor R85 (at the fold-back point) shown in FIG. 21. When the number M of battery modules is further increased, replacement will be described in the following. When the number M of battery modules is (4n+1), the one-battery-module-type battery unit 50 is disposed in the position of the resistor R85 of the four-battery-module-type battery-module 80 which is disposed at the center of the circuit. When the number M of battery modules is (4n+2), the two-battery-module-type battery unit 60 is disposed in the position of the resistor R85 of the four-battery-module-type battery-module 80. When the number M of battery modules is (4n+3), the three-battery-module-type battery unit 70 is disposed in the position of the resistor R85 of the four-battery-module-type battery-module 80. When the number M of battery modules is 4n, the four-battery-module-type battery unit 80 is disposed in the position of the resistor R85 of the four-battery-module-type battery-module 80.

As described above, the embodiment of the present invention can reduce the difference in frequency response of the battery module whose voltage is detected. When there is no difference in output voltage waveform of each battery module, there is no difference in voltage waveform through a filter. Consequently, the embodiment of the present invention can prevent the battery modules from erroneously being determined as if it were in an irregular condition. When a photo MOS relay is provided, a sampling frequency of switching is forced to be low due to a long delay in switching. However, since the embodiment of the present invention can reduce the difference in frequency responses, the anti-aliasing filter can provide relatively a high cut-off frequency. The battery module voltage detector includes a flying capacitor wherein a pair of the switches Sw1 and Sw2*m* and a pair of the switches Swd1 and Swd2 are alternately opened and closed, so that the battery pack 11 and the differential amplifier are insulated with each other.

Comparative Example 1

Figure 23:
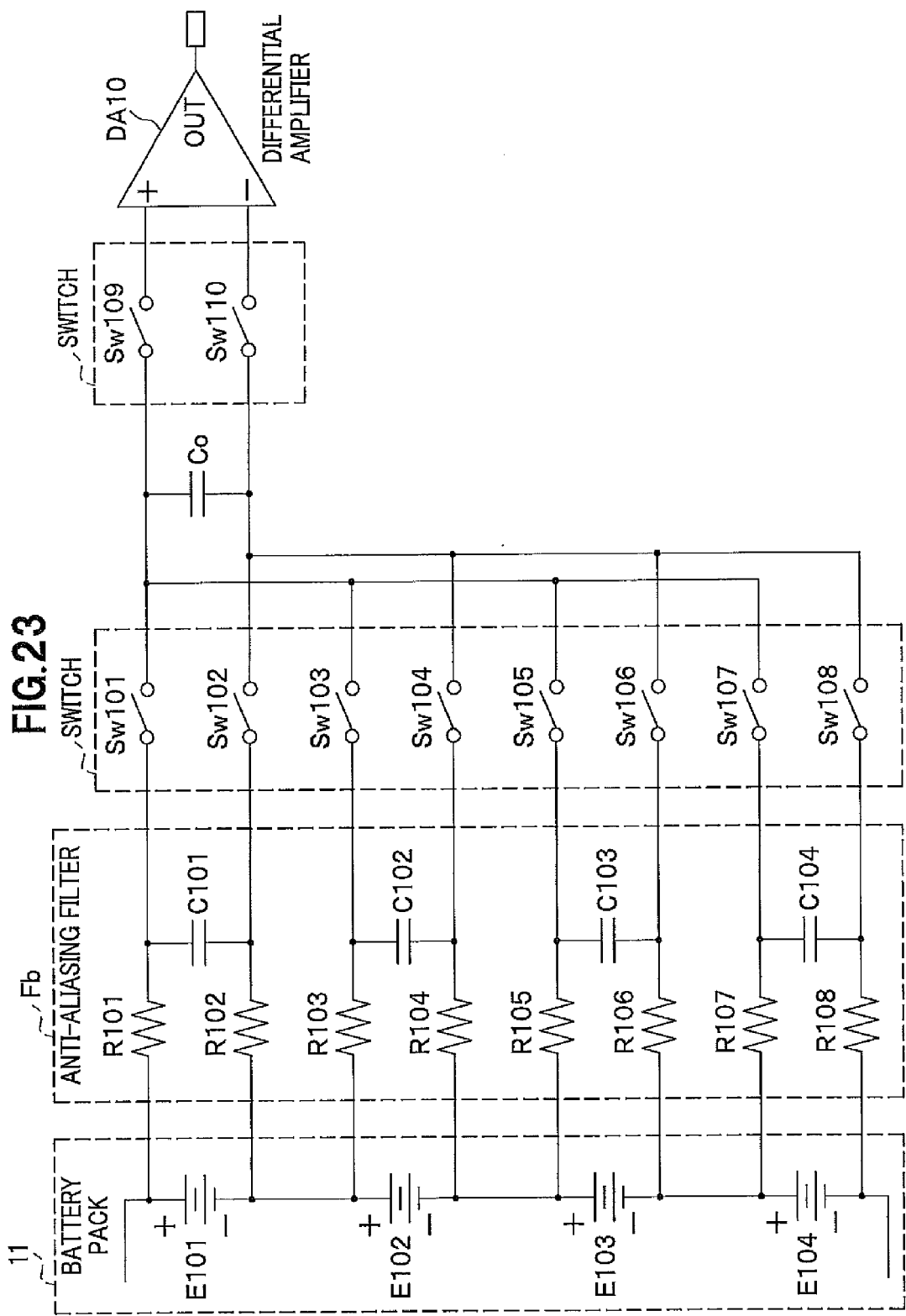
FIG. 23 is a circuit diagram of the battery module voltage detector wherein a flying capacitor topology is applied.

FIG. 23 is a comparative example showing a battery module voltage detector wherein a flying capacitor topology is formed so as to measure the voltages of four battery modules.

In FIG. 23, the battery pack of the voltage detecting device is comprised of battery modules E101, E102, E103, and E104 in series. An anti-aliasing filter Fa is comprised of four low-pass filters. One low-pass filter includes two resistors R101 and R102 connected to both ends of the battery module E101, and a capacitor C101 connected to one end of the two resistors. Each of the other three low-pass filters also includes two resistors and a capacitor, corresponding to respective battery modules E102 to E104. The resistors R101 to R108 are of equal resistance value, and the capacitors C101 to C104 are of equal capacitance.

As shown in the circuit of the voltage detecting device of FIG. 7, there is one connecting point between the battery modules, each of the connecting points is connected to one resistor. On the other hand, as shown in the circuit of the voltage detecting device of FIG. 23, there are two connecting points between the battery modules, each of the two connecting points is connected to one resistor.

Comparative Example 2

Since the switches are relatively expensive, a voltage detecting circuit in which the number of the switches is reduced can be provided as shown in FIG. 24.

Figure 24A:
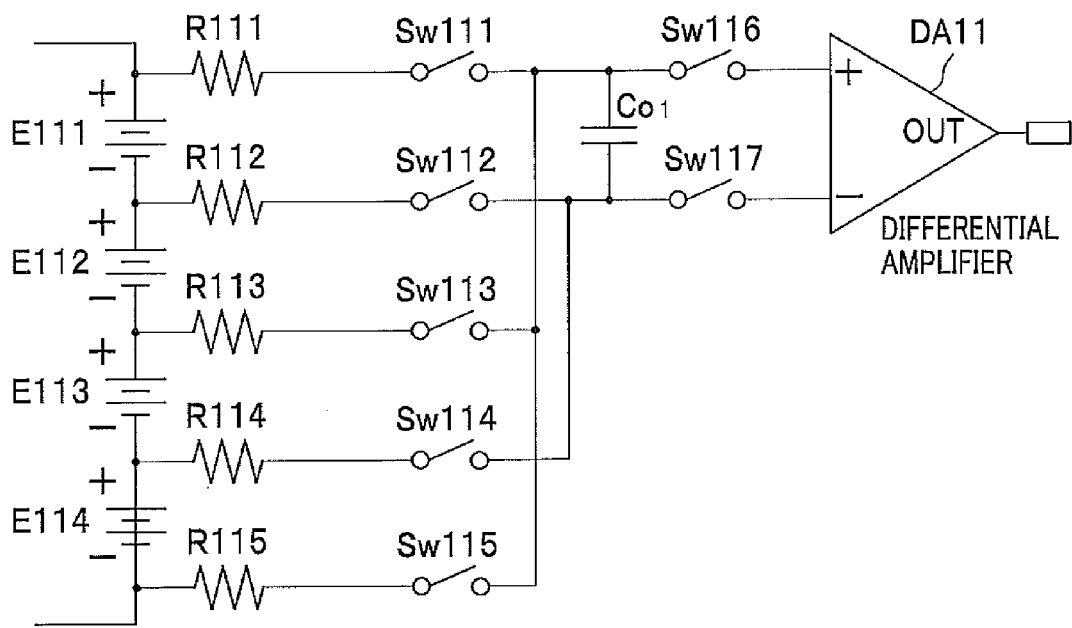
FIGS. 24A and 24B are another circuit diagrams of the battery module voltage detector wherein a flying capacitor topology is applied.
Figure 24B:
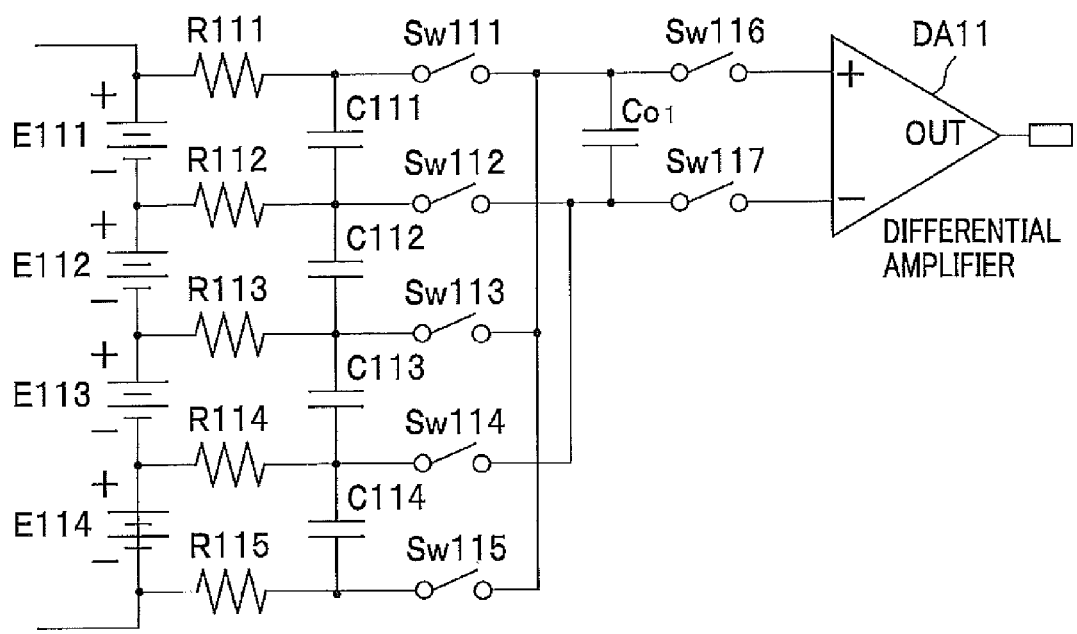

As compared with FIG. 23, in FIG. 24A, the number of switches is reduced to approximately the half. As shown in FIG. 34B, when capacitors C111 to C114 having equal capacitance are added to the circuit of FIG. 24A to form an anti-aliasing filter, the circuit of FIG. 24B is different from the circuit of FIG. 23 of the comparative example 1. When the alternating-current voltage component of each battery module is measured, one element is reciprocally affected with another element, so that the difference in frequency response of each anti-aliasing filter appears.

The case where one battery module is provided is exemplified so as to examine the frequency response of the anti-aliasing filter. Back to FIG. 8, the circuit of FIG. 8 is a first anti-aliasing filter including one battery module E1, two resistors R11 and R12 having an equal resistance value, and the capacitor C11.

Figure 26:
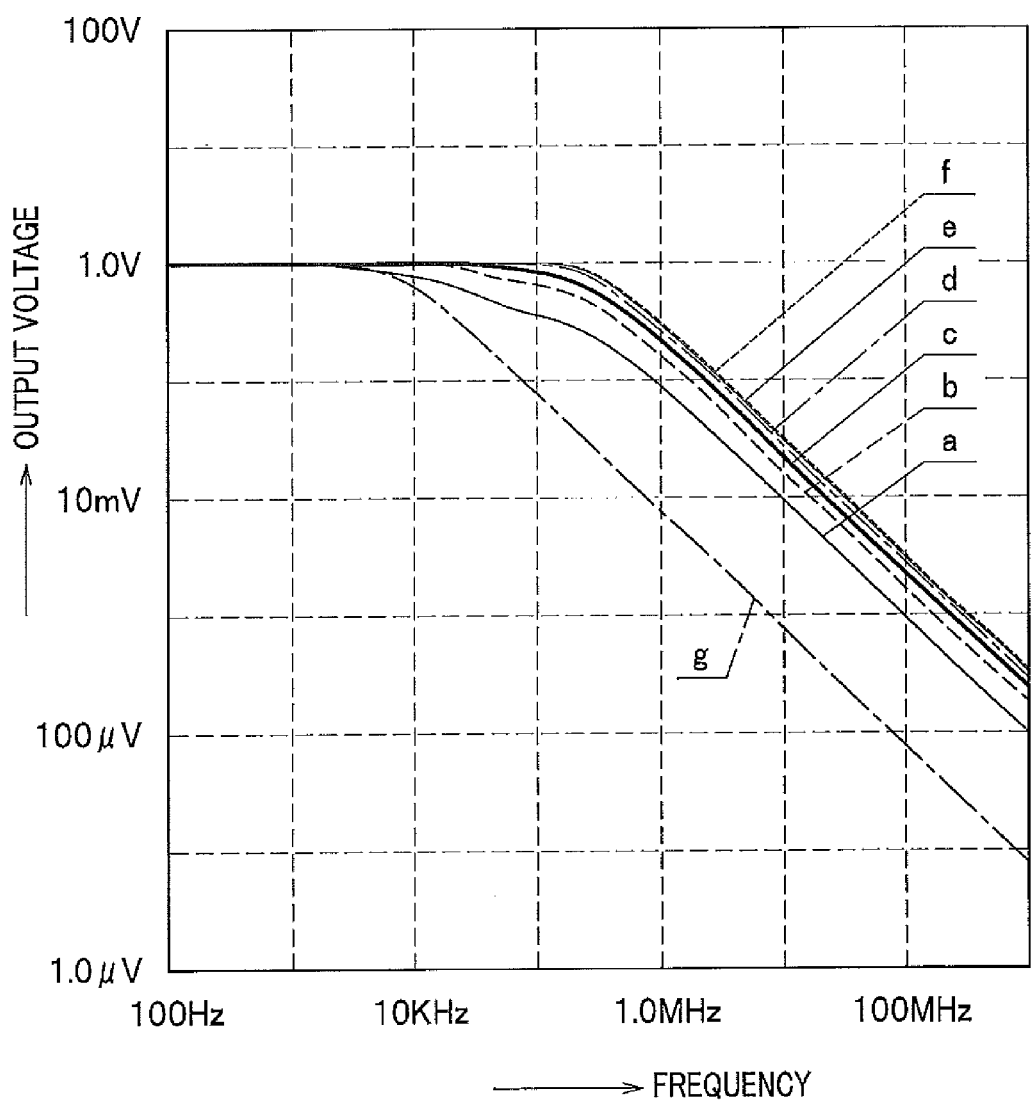
FIG. 26 is a graph of a frequency characteristic curve of the anti-aliasing filter shown in the circuits of FIGS. 2, 14A, and 14B.

In this circuit where direct-current electromotive force of the battery module E11 is 0 V, alternating-current electromotive force the battery module E11 is 1 V, the resistance value of the resistor R11 and R12 is 100 Ω(ohm), and the capacitance of the capacitor C11 is 0.1 μF, the value of a measured voltage (output voltage) across the capacitor C11 corresponding to each alternating-current frequency is shown in the characteristic curve G of the anti-aliasing filter in FIG. 26.

Figure 25:
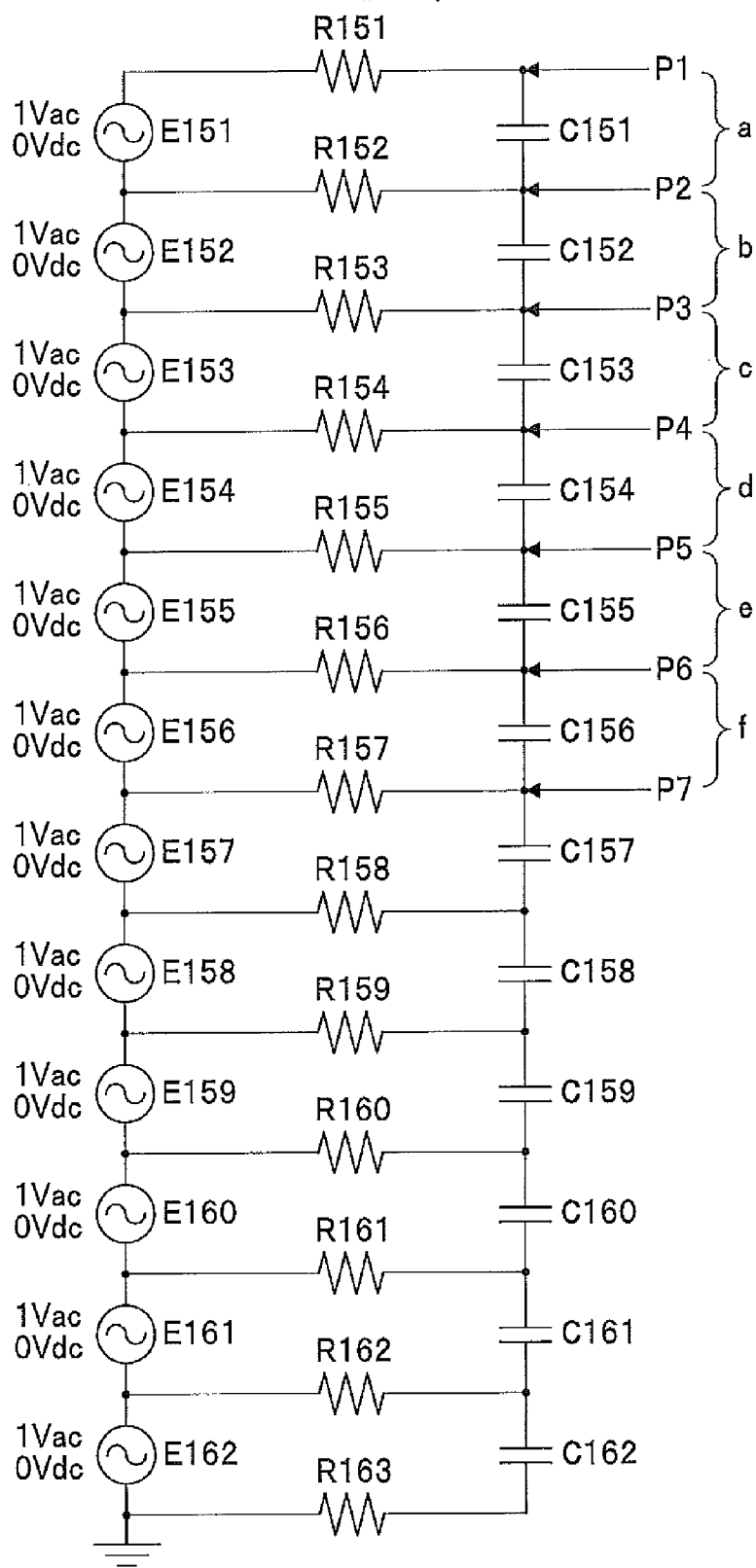
FIG. 25 is a circuit diagram of the battery module voltage detector wherein a plurality (twelve) of battery modules are provided.

FIG. 25 shows a voltage detecting circuit for battery modules wherein a plurality (twelve) of battery modules E151 to E162 are connected in series.

As is the case where one battery module is provided in FIG. 8, FIG. 25 shows an anti-aliasing filter which includes resistors R151 to R163 having an equal resistance value and capacitors C151 to C162 having equal capacitance.

As is the case where one battery module is provided, direct-current electromotive force of battery modules E151 to E162 is 0 V, alternating-current electromotive force of the battery modules E151 to E162 is 1 V, resistance value of resistors R151 to R163 is 100 Ω(ohm), and capacitance of capacitors C151 to C162 is 0.1 µF.

In this case, FIG. 26 shows the frequency characteristic curves of the anti-aliasing filters on the basis of the value of a measured voltage (output voltage) across the capacitors C151 to C162 corresponding to a frequency. For example, a solid line A in FIG. 26 shows the frequency characteristic curve corresponding to the voltage across the capacitor C151. A positive electrode of the capacitor C151 at a point P1 and a negative electrode of the capacitor C151 at a point P2 are respectively measured. A dotted line B in FIG. 26B shows the frequency characteristic curve corresponding to the voltage across the capacitor C152 whose positive electrode at the point P2 and negative electrode at the point P3 are measured. As is the case with the capacitors C151 and C152, a solid line C in FIG. 26 shows the frequency characteristic curve of the voltage across the capacitor C153, a chain line D in FIG. 26 shows the frequency characteristic curve of the voltage across the capacitor C154, a chain line E in FIG. 26 shows the frequency characteristic curve of the voltage across the capacitor C155, and a dotted line in FIG. 26 shows the frequency characteristic curve of the voltage across the capacitor C156.

As shown in the frequency characteristic curves of the lines A to F of FIG. 26, when the anti-aliasing filters constituted in a ladder type are applied to a plurality of battery modules E151 to E162, and each rated value of elements of the anti-aliasing filters is equal to the rated value of the elements of one filter where one battery module is provided, the cut-off frequency of the anti-aliasing filters rises to a large extent. The closer the anti-aliasing filter comes to the center of the circuit which includes battery modules connected in series and the capacitors, the higher the cut-off frequency becomes. Consequently, the cut-off frequency characteristic of the anti-aliasing filter becomes inhomogeneous.

The embodiment shown in FIG. 7 can solve the problem and reduce the difference in frequency response of the anti-aliasing filter.

Modified Example

The embodiments of the present invention is not limited, but can be modified as described below.

In the embodiments described above, the anti-aliasing filter is constituted of a low-pass filter having the resistor and the capacitor. However, the anti-aliasing filter can be constituted of the capacitor and a coil, instead of the resistor.

The resistor can be replaced with a capacitor and a plurality of switches which constitute a switched capacitor topology.

Figure 27:
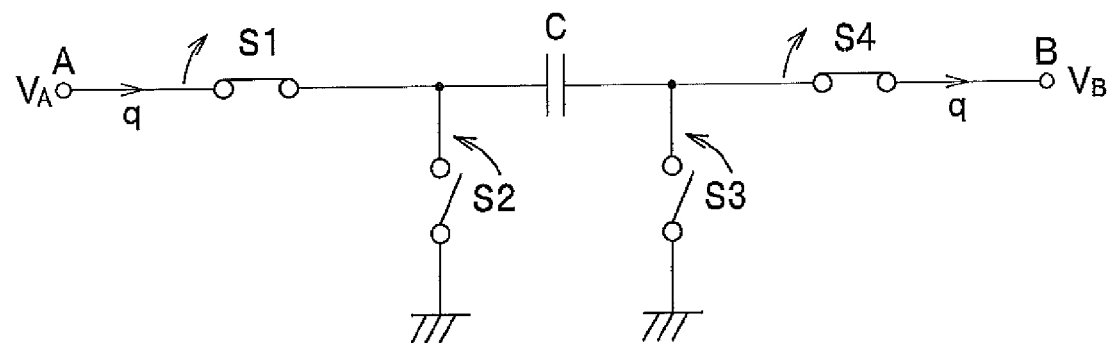
FIG. 27 is a circuit diagram of a switched capacitor circuit.

For example, FIG. 27 shows a switched capacitor circuit in which a capacitor C is disposed between points A and B, both ends of the capacitor C are connected to switches S1 and S4, a connecting point between the capacitor C and the switch S1 is connected to a switch S2 which is grounded, and a connecting point between the capacitor C and the switch S4 is connected to a switch S3 which is grounded.

In this time, a pair of switches S1 and S4 and a pair of switches S2 and S3 are alternately opened and closed at a sampling time interval T, so that a charge Q of the capacitor C flows between the points A and B.

In the case where the capacitor is repeatedly charged and discharged, an electric potential of the point A is "Va" and an electric potential of the point B is "Vb", and the capacitance of the capacitor C is "C0", an average current Iav flown between the points A and B is described as follows;

$$Iav = Q/T = (C0/T)(Va-Vb) = (Va-Vb)/R$$

Accordingly, the switched capacitor circuit of FIG. 27 becomes equivalent to a resistor having the resistance value R (R=T/C0).

The switching circuits shown in FIGS. 1 and 7 are constituted by an analog multiplexer and can be integrally or separately constituted with the voltage detecting circuit DA1. In the case where the switching circuit is integrally constituted with the voltage detecting circuit DA1, the capacitor C01 and the switches Swd1 and Swd2 (FIGS. 1 and 7) are not provided, and an output voltage of the switches Swm1 to Swm (m+1) is directly detected.

Third Embodiment

Figure 28:
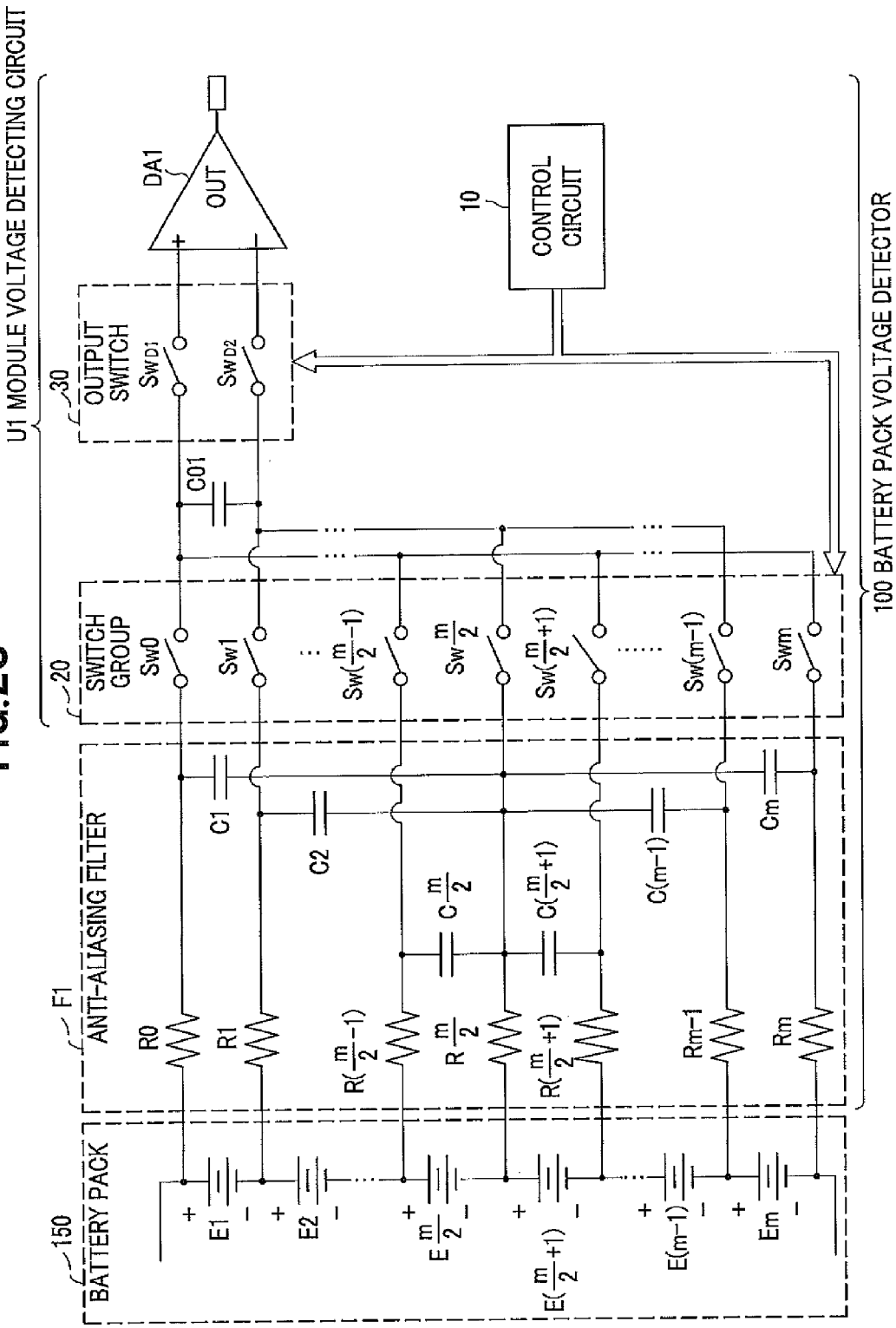
FIG. 28 is a circuit diagram of a battery module voltage detector according to a third embodiment.

FIG. 28 is a circuit diagram of a battery pack voltage detector 100 (battery module voltage detector) according to a third embodiment of the present invention.

In FIG. 28, a battery pack voltage detector 100 measures voltages in a battery pack 150 including a plurality of battery modules E1 via Em/2, E(m/2+1) to Em (m is an even number) connected in series. The battery pack voltage detector 100 includes an anti-aliasing filter FL a module voltage detecting circuit U1, and a control circuit 10. The module voltage detecting circuit U1 includes a switch group 20 including switches Sw0 via Sw(m/2−1), Sw(m/2), Sw(m/2+1) to Swm), and a capacitor C01, an output switch 30 (Sw$_{D1}$ and Sw$_{D2}$), and a differential amplifier DA1. Photo MOS relays are used for the switches Sw0 to Swm, and the switches Sw$_{D1}$ and Sw$_{D2}$. The battery modules E1 to E6 (when the number of the battery modules is six, see FIG. 29) in the battery pack 150 are connected to the anti-aliasing filter F1 through input terminals Fi0, Fi1, - - - , and Fi6.

Because there are a reason that Voltages in the battery pack 150 are too high to be measured and an object to measure each of the battery modules E1, E2, - - -, and Em, the control circuit 10 successively switches the switches Sw0 to Swm to measure an output voltage difference between each pair of adjacent resistors.

For example, when the battery module E1 is measured, a pair of the switch Sw0 and Sw1 are made close to charge the capacitor C01 with the voltage of (charges from) the battery module E1. After a predetermined time passed, the battery pack voltage detector 100 make the pair of the switches Sw0 and Sw1 open and the switches Sw$_{D1}$ and Sw$_{D2}$ close to supply the charged voltage to an A/D converter (not shown) through the differential amplifier DA1. The control circuit 10 successively performs the voltage detection in order from the battery modules E1, E2, - - - , to Em.

In other words, the battery pack voltage detector 100 is successively connected to the battery modules E1, E2, to Em and the output voltage difference between a pair of adjacent resistors is charged in the capacitor C01 by closing a pair of the switches out of the switches Sw0 to Swm. After a predetermined time interval elapses, the battery pack voltage detector 100 makes the pair of the switches open and the switch $Sw_{D1}$ and $Sw_{D2}$ close to detect the voltage charged in the capacitor C01 through the differential amplifier DA1, and calculates the voltage of the battery module from the detected voltage value. During this operation, the control circuit 10 controls the switching of the switches Sw0 to Swm, and the switches $Sw_{D1}$ and $Sw_{D2}$.

The anti-aliasing filter F1 includes (m+1) resistors having the same resistance and m capacitors C1 to Cm having the same capacitance. Each of the resistors R0 to Rm is connected between a voltage detection terminal of each of the battery modules E1 to Em and each of the switches Sw0 to Swm. Each of the capacitors C1, C2, - - - , C(m/2), C(m/2+1), - - -, C(m−1), and Cm is connected between an output terminal of the resistor R(m/2) which is (1+m/2)-th in order from the resistor R0 (R0 is first) and the output terminal of each of the resistors R0 to Rm.

Figure 29:
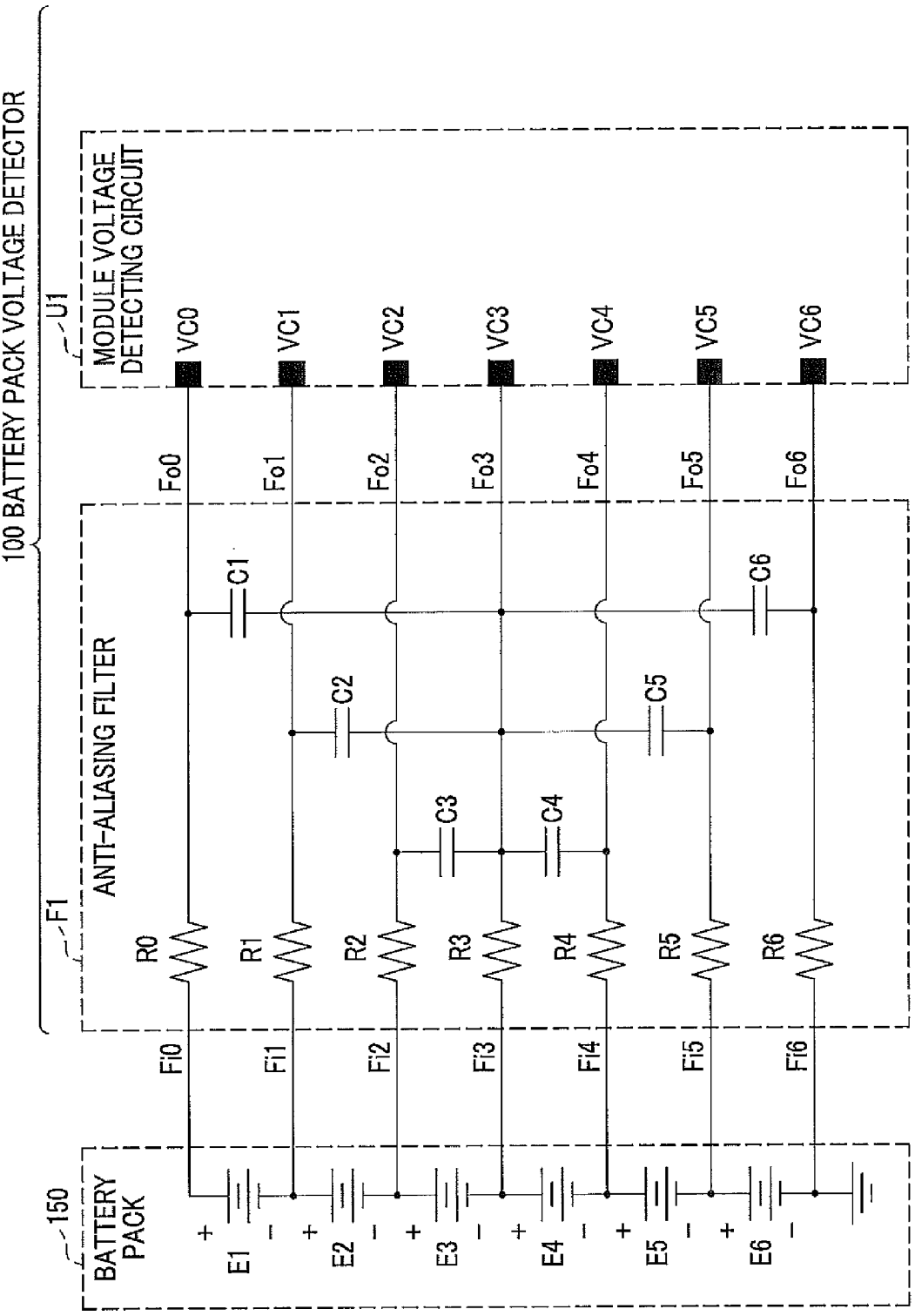
FIG. 29 is a circuit diagram of the battery module voltage detector when m=6 in FIG. 28.

FIG. 29 is a circuit diagram of the battery pack voltage detector 100 in a case that m=6.

More specifically, the battery pack voltage detector 100 includes the anti-aliasing filter F1, and the module voltage detecting circuit U1 to measure the battery module voltages in the battery pack 150.

The battery pack 150 includes battery modules E1, E2, - - - , E6 each having the same specification under a predetermined standard. The anti-aliasing filter F1 is connected to the battery modules E1, E2, - - -, and E6 through the input terminals Fi0, Fi1, - - -, and Fi6 and connected to inputs VC0, VC1, - - - , and VC6 of the module voltage detecting circuit U1 through output terminals Fo0, Fo1, - - - , and Fo6.

The anti-aliasing filter F1 includes seven resistors R0, R1, - - -, and R6 each having a resistance of r0, six capacitors C1, C2, - - - , and C6 each having a capacitance of c0. The resistors R0, R1, - - -, and R6 are connected between the input terminals Fi0, Fi1, - - - , and Fi6 and the output terminals Fo0, Fo1, - - - , and Fo6, respectively. One ends of all capacitors Fo0, Fo1, - - - , and Fo6 are connected to a junction between the resistor R3 and the output terminal Fo3.

The other ends of the capacitors C1, C2, - - - , and C6 are connected to the resistors R0, R1, R2, R4, R5, R6, respectively except the resistor R3 and the output terminal Fo0, Fo1, Fo2, Fo4, Fo5, and Fo6, respectively, except the output terminal Fo3. In other words, the anti-aliasing filter F1 is configured line-symmetrically about the resistor R3 between high and low potential sides.

Figure 30:
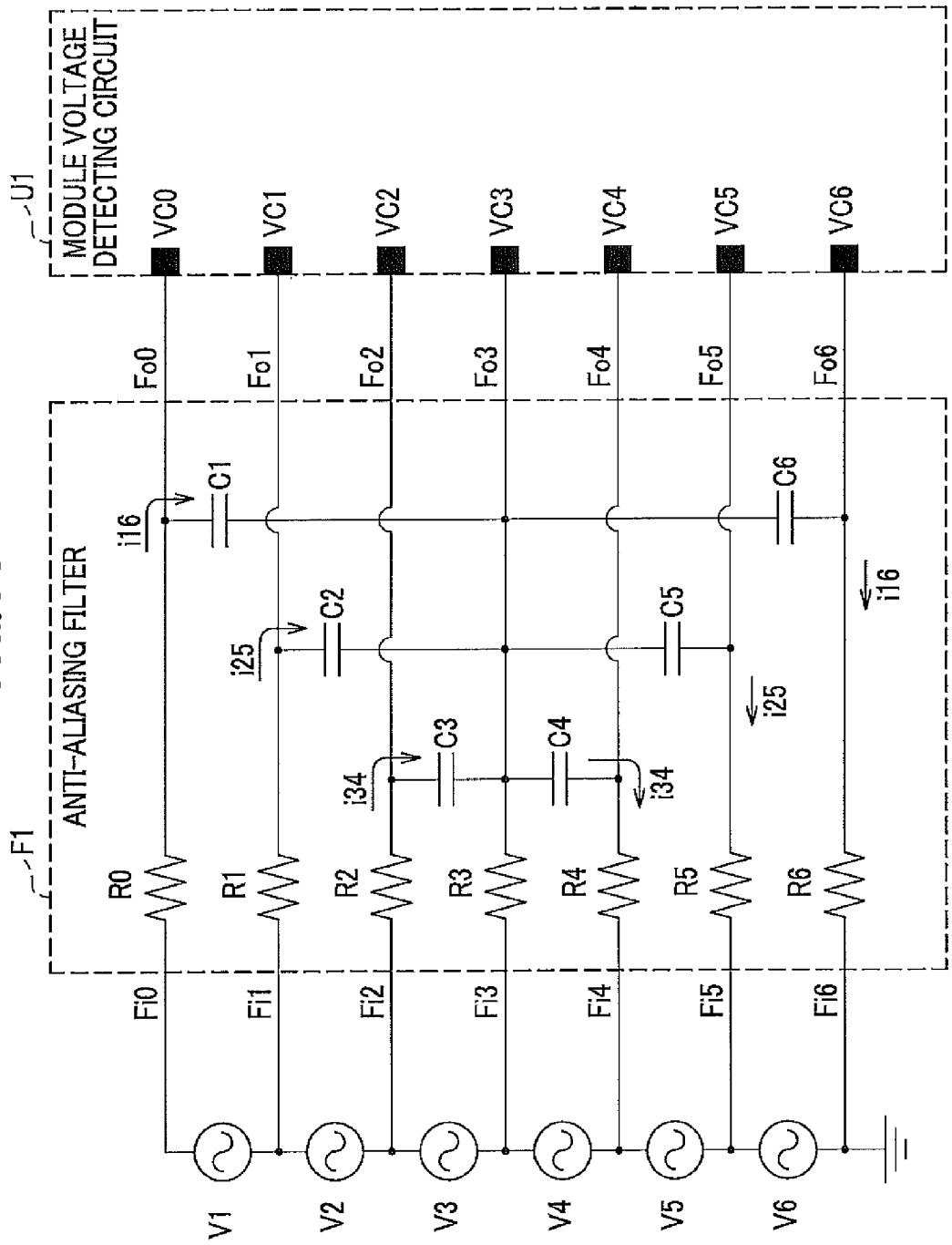
FIG. 30 is an equivalent circuit diagram regarding AC voltage components for illustrating a filter characteristic.

FIG. 30 is an equivalent circuit diagram regarding AC voltage components to explain a filter characteristic of the battery pack voltage detector 100 shown in FIG. 29. More specifically, the battery modules E1, E2, - - - , and E6 are replaced with AC voltage components V1, V2, - - - , and V6.

The anti-aliasing filter F1 is configured line-symmetrically about the resistor R3 between the high potential side and a grounded side (low potential side). If it is assumed that the AC voltage components V1, V2, - - - , and V6 have the same voltage v0, a current i16 caused by the AC voltage components V1+V2+ - - - , +V6 flows through the resistor R0, the capacitors C1 and C6, and the resistor R6. A current i25 caused by the AC voltage components V2+V3+V4+V5 flows through the resistor R1, the capacitors C2 and C5, and the resistor R5. A current i34 caused by the AC voltage components V3+V4 flows through the resistor R2, the capacitors C3 and C4, and the resistor R4. Accordingly, no current flows through the resistor R3, so that the resistor R3 can be replaced with a wire (wire conductor).

It is assumed that $Z0=2/j\omega c0$, potentials at the output terminals Fo0, Fo1, Fo1, Fo3, Fo4, Fo5, and Fo6 are calculated.

Because no current flows through the resistor R3, the potential of the output terminal Fo3 is equal to the input terminal Fi3, that is, 3·v0. The potential vFo0 of the output terminal Fo0 can be given by Eq. (11).

$$vFo0=3/v0+3·v0·Z0/(Z0+r0) \tag{11}$$

The potential vFo1 at the output terminal Fo1 is given by Eq. (12).

$$vFo1=3·v0+2·v0·Z0/(Z0+r0) \tag{12}$$

The potential vFo2 at the output terminal Fo2 is given by Eq. (13).

$$vFo2=3·v0+v0·Z0/(Z0+r0) \tag{13}$$

The potential vFo3 at the output terminal Fo3 is given by Eq. (14).

$$vFo3=3·v0 \tag{14}$$

The potential vFo4 at the output terminal Fo4 is given by Eq. (15).

$$vFo4=3·v0-v0·Z0/(Z0+r0) \tag{15}$$

The potential vFo5 at the output terminal Fo5 is given by Eq. (16).

$$vFo5=3·v0-2·v0·Z0/(Z0+r0) \tag{16}$$

The potential vFo6 at the output terminal Fo6 is given by Eq. (17).

$$vFo6=3·v0-3·v0·Z0/(Z0+r0) \tag{17}$$

A potential difference between the output terminal Fo0 and the output terminal Fo1 is given by Eq. (18).

$$vFo0-vFo1=v0·Z0/(Z0+r0) \tag{18}$$

A potential difference between the output terminal Fo1 and the output terminal Fo2 is given by Eq. (19).

$$vFo1-vFo2=v0·Z0/(Z0+r0) \tag{19}$$

A potential difference between the output terminal Fo2 and the output terminal Fo3 is given by Eq. (20).

$$vFo2-vFo3=v0·Z0/(Z0+r0) \tag{20}$$

A potential difference between the output terminal Fo3 and the output terminal Fo4 is given by Eq. (21).

$$vFo3-vFo4=v0·Z0/(Z0+r0) \tag{21}$$

A potential difference between the output terminal Fo4 and the output terminal Fo5 is given by Eq. (22).

$$vFo4-vFo5=v0·Z0/(Z0+r0) \tag{22}$$

A potential difference between the output terminal Fo5 and the output terminal Fo6 is given by Eq. (23).

$$vFo5-vFo6=v0·Z0/(Z0+r0) \tag{23}$$

In other words, potential differences between adjacent output terminals are all the same.

Figure 31:
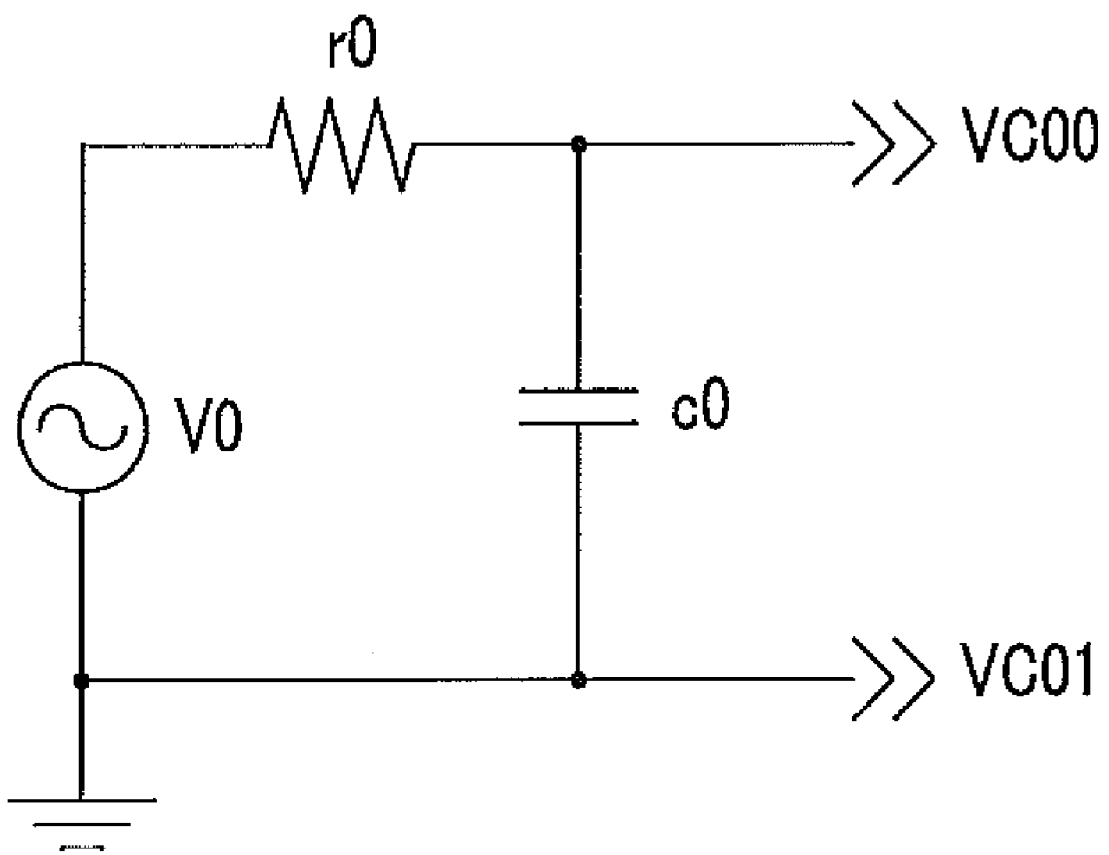
FIG. 31 is an equivalent circuit diagram of one stage of an RC filter showing a frequency characteristic between adjacent output terminals.

Accordingly, an equivalent circuit between adjacent output terminals regarding frequency characteristic can be represented by a one stage of RC filter as shown in FIG. 31 and has a cutoff frequency $f0=1/(c0r0)$.

More specifically, the equivalent circuit shows a series circuit including a resistor with a resistance r0 and a capacitor with a capacitance c0 between both terminals of an AC voltage component V0. Output voltages VC00 and VC01 are outputted between both terminals thereof.

Thus, according to the third embodiment, in the voltage component detected between the adjacent output terminals, inputs are evenly low-passed, and the cutoff frequency is appropriately set to a sampling frequency of the A/D converter to reduce aliasing error. Further, because the each of voltages applied to the capacitors C1 and C6 is a half of all voltages (V1+V2+ . . . +V6), low price capacitors with a low dielectric voltage can be used.

If there is not-negligible resistance in wires between the battery pack 150 and the anti-aliasing filter F1, an adverse effect of the wiring resistance is low in a case where the wiring resistance is sufficiently lower than the resistance r0 of the resistors R0, R1, - - -, and R6.

Next, will be considered a case where there are differences in internal impedance due to deterioration in battery modules E1, E2, - - -, and E6. In this case, the AC voltage components become not even, so that a not-negligible current flows through the resistor R3 which generates a voltage difference between the input terminal Fi3 and the output terminal Fo3. The voltage difference causes a measurement error. However, this measurement error can be decreased by suppressing the voltage difference by using a wire conductor for the resistor R3 which sufficiently low resistance, i.e. approximately zero.

Comparative Example 3

Figure 32:
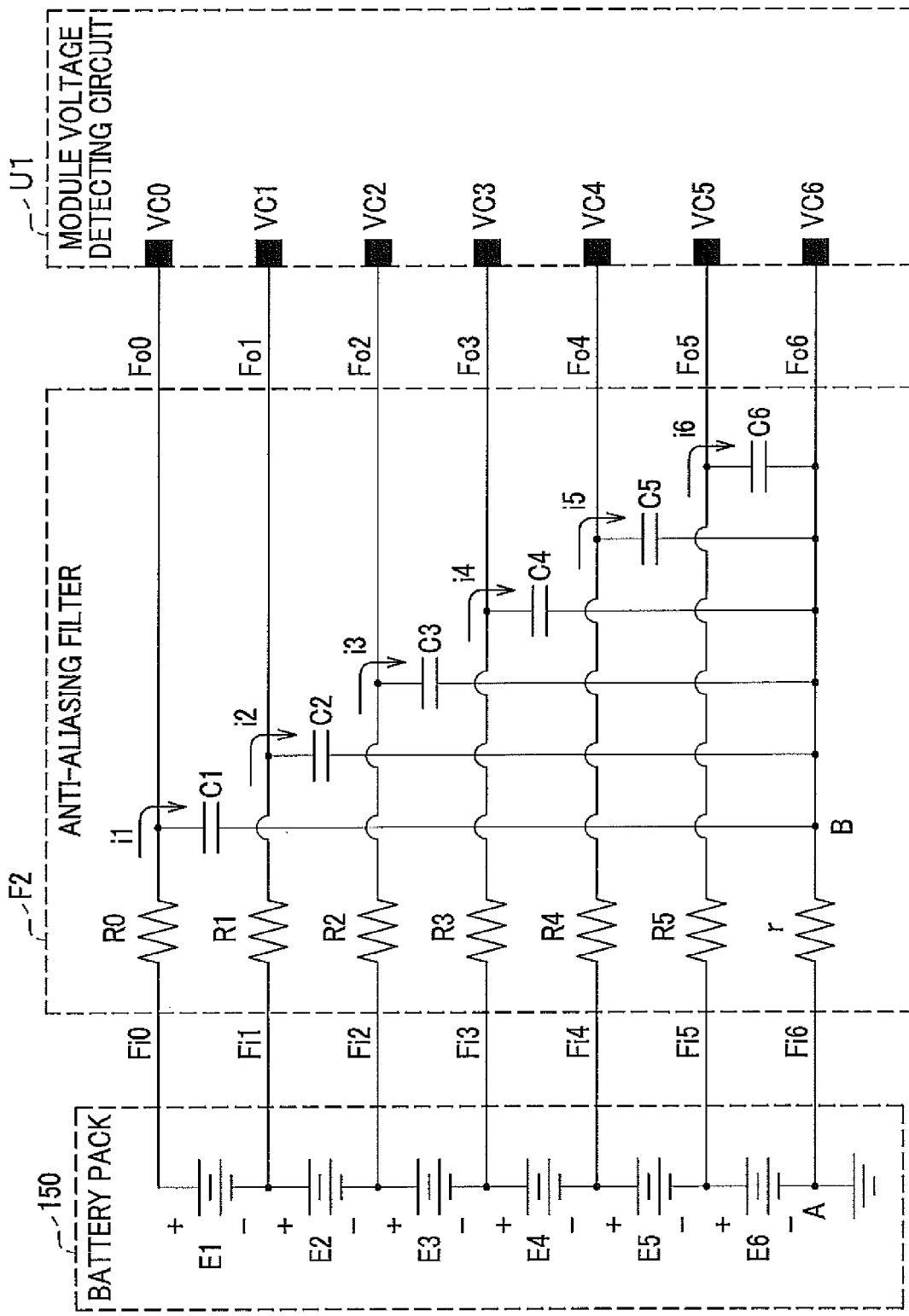
FIG. 32 is a circuit diagram of a third comparative example of a battery module voltage detector.

FIG. 32 shows a third comparative example considered by the inventors. In the circuit, a negative terminal of the battery pack 150, i.e., a negative terminal of a battery module E6 and all capacitors C1, C2, - - -, and C6 are commonly grounded. Components used in the circuit shown in FIG. 32 are substantially the same as those in FIG. 29, but connection is different, and the resistor R6 is replaced with a conductor with a resistance r.

In the circuit shown in FIG. 29, one ends of all capacitors C1, C2, - - -, and C6 are connected to one end of the resistor R3. On the other hand, in the anti-aliasing filter F2 in the third comparative example, one ends of the capacitors C1 to C6 are connected to a point B which is connected to a grounded point A for the negative terminal of the battery pack 150 in which all capacitors C1, C2, - - -, and C6 are connected through the conductor with a resistance r.

In this case, because a sum of AC components flowing through the capacitors C1, C2, - - -, and C6 (i1+i2+ . . . +i6) flows through the conductor with the resistance r, a potential of the point B, i.e., a potential of the output terminal Fo6 varies. This generates a measurement error.

Comparative Example 4

Figure 33:
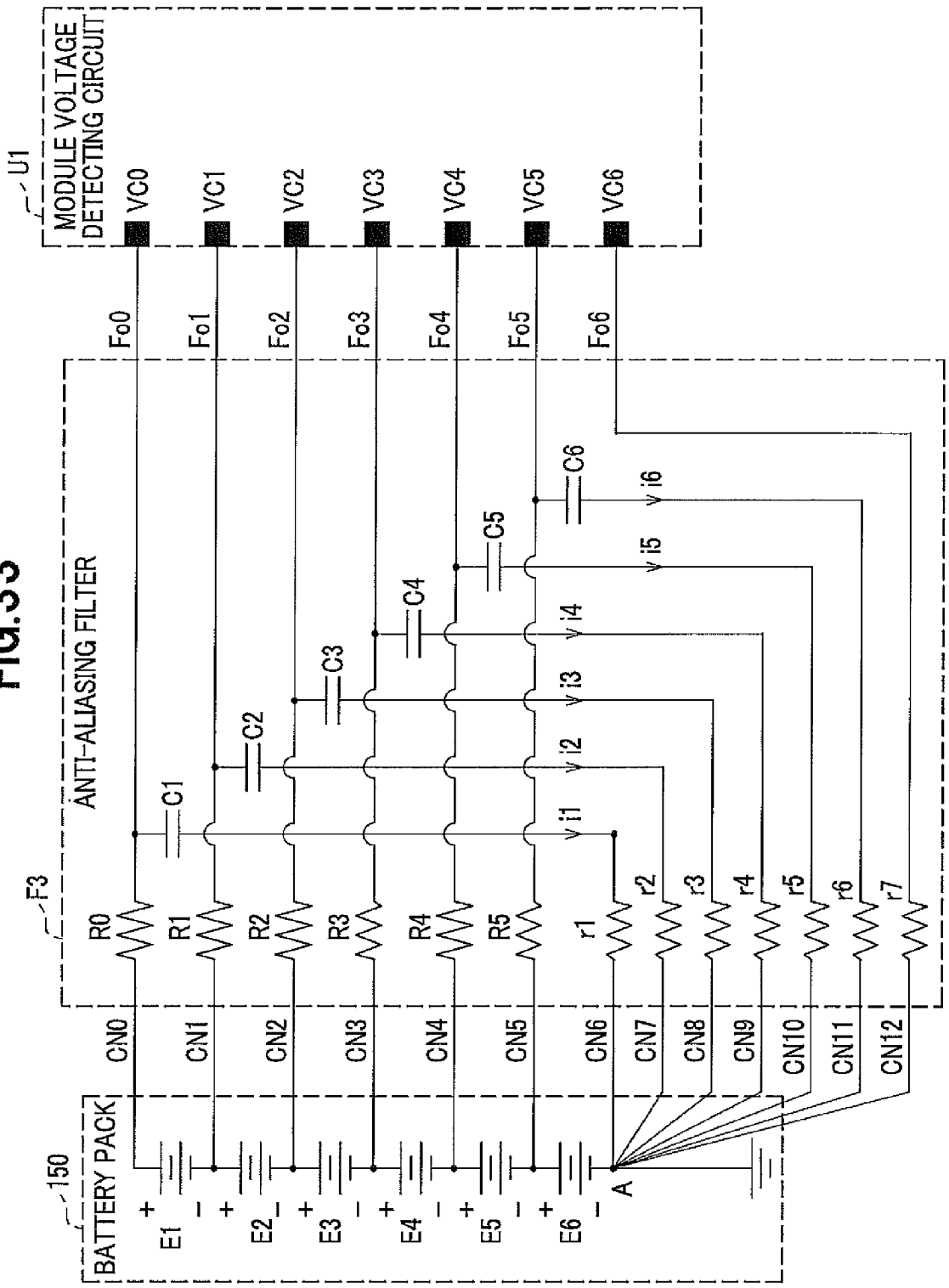
FIG. 33 is a circuit diagram of a fourth comparative example of a battery module voltage detector.

FIG. 33 shows a fourth comparative example considered by the inventors. To avoid the voltage variation generated by the conductor with the resistance r in the third comparative example, the capacitors are grounded at one location of the negative terminal A of the battery pack 150. Components used in the circuit shown in FIG. 33 are substantially the same as those in FIG. 29, but connection is different.

More specifically, the resistor R6 is not used, and one ends of the capacitors C1 to C6 are connected to the negative terminal A through conductors with resistance components r1 to r6 via connectors CN6 to CN11, respectively. The resistors R0 to R5 are connected to the battery pack 150 via connectors Cn0 to CN 5, respectively. Further a conductor wire with a resistance component r7 is connected to the output terminal Fo6 via a connector CN12.

Accordingly, currents from the capacitors C1 to C6 flow through the resistance components r1 to r6, respectively, and no current flows through the resistance component r7. Thus, the output terminal Fo6 is not subjected to the potential variation. However, the connectors CN7 to CN11 are added, so that the number of parts is increased.

Comparative Example 5

Figure 34:
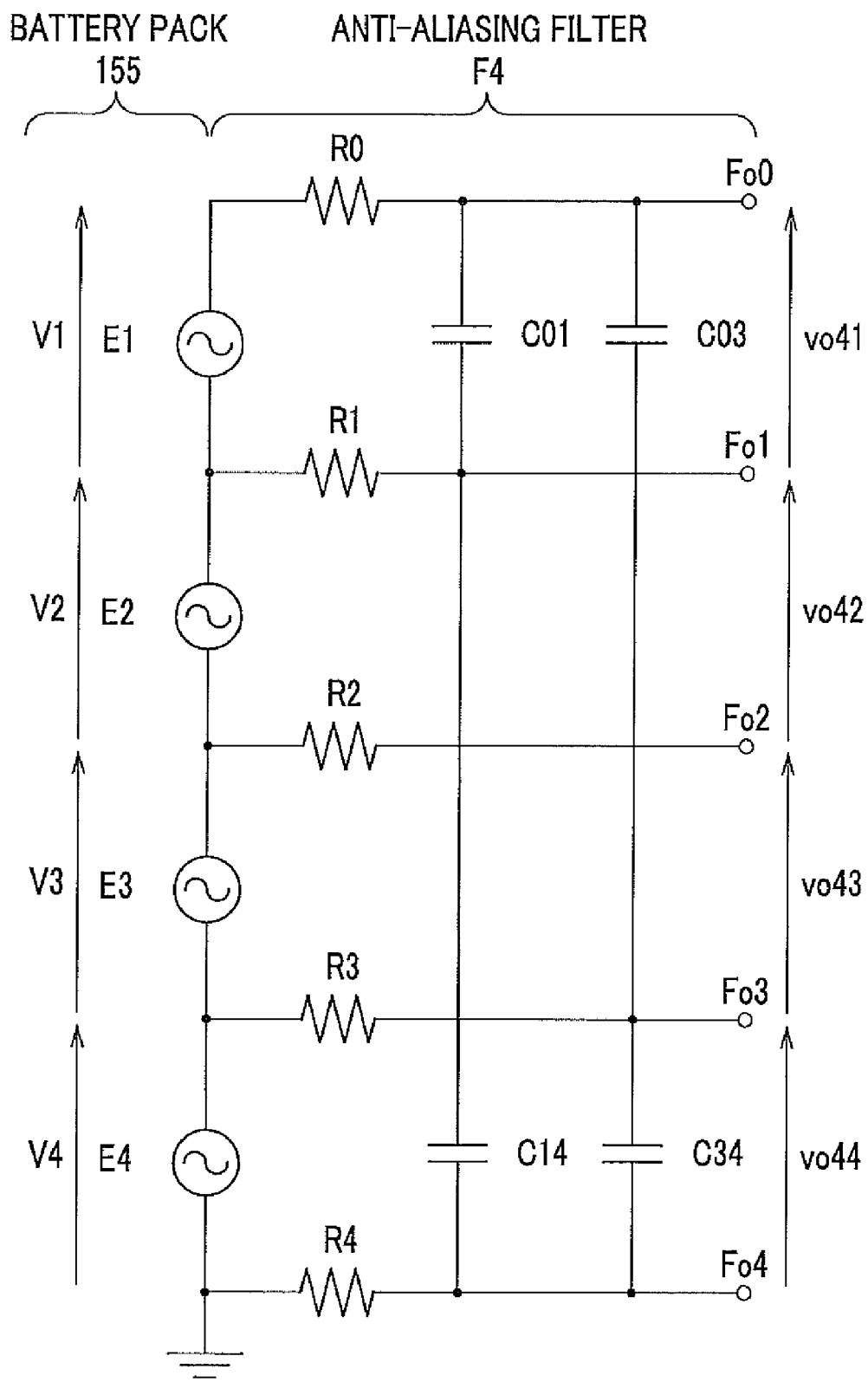
FIG. 34 is a circuit diagram of a fifth comparative example of a battery module voltage detector.

FIG. 34 shows a fifth comparative example considered by the inventors. A battery pack 155 includes battery modules E1 to E4 in which filtering characteristics between adjacent terminals of the battery modules E1 to E4 are equivalent with each other.

The anti-aliasing filter F4 includes resistors R0 to R4 and capacitors C01, C14, C03, and C34. The battery modules E1 to E4 in the battery pack 155 are connected in series and generate AC voltage components V1 to V4, respectively.

The resistor R0 is connected at one end thereof to a positive terminal of the battery module E1. One end of the resistor R1 is connected to a junction between the battery modules E1 and E2. One end of the resistor R2 is connected to a junction between the battery modules E2 and E3. One end of the resistor R3 is connected to a junction between the battery modules E3 and E4. One end of the resistor R4 is connected to a negative terminal of the battery module E4. The other ends of the resistors R0 to R4 are connected to the output terminals Fo0, Fo1, Fo1, Fo3, and Fo4.

A capacitor C01 is connected between the other end of the resistor R0 and the other end of the resistor R1. A capacitor C14 is connected between the other end of the resistor R1 and the other end of the resistor R4. A capacitor C03 is connected between the other end of the resistor R0 and the other end of the resistor R3. A capacitor C34 is connoted between the other end of the resistor R3 and the other end of the resistor R4.

For example, if only a voltage V1 of the battery module E1 varies, a current flows through the capacitors C01 and C03 because the voltages applied to the capacitors C01 and C03 vary. Therefore, it is undesirable that the potential of the output terminals vary, and the monitored voltages vo42, vo43, and vo44 vary.

On the other hand, in the circuit shown in FIG. 29, when the voltage of the battery module E1 varies, a variation current flows only through the resistor R3 via the capacitor C1, and no variation current flows through the other resistors R1, R2, R4, R5, and R6. Further, if the resistor R3 is replaced with a conductor, there is no variation in the potentials of any output terminal.

Further, in the structure shown in FIG. 33, there is no potential variation at the terminals other than the output terminal Fo0. More specifically, when the voltage of the battery module E varies, only a variation current flows through the resistor R0, the capacitor C1, the resistor component r1 of the conductor, and the connector CN6, but no variation current flows through the resistance components r2, r8, - - -, and r7 of the other conductors. Accordingly, no potential variation occurs at the output terminals Fo1, Fo2, - - -, and Fo6.

What is claimed is:

1. A battery module voltage detector that detects a voltage of each of battery modules, wherein each battery module including one cell or more, and M battery modules are connected in series as a battery pack, and "M" is a positive integer, the battery module voltage detector comprising:

(M+1) voltage detecting terminals connected to a positive electrode of a battery module having a highest potential, a negative electrode of a battery module having a lowest potential, and (M−1) connecting points between the battery modules adjacent to each other, respectively;

a filter circuit having input terminals which are connected to the voltage detecting terminals, respectively;

switching circuits having input terminals which are connected to output terminals of the filter circuit, respectively; and a voltage detecting circuit connected to output terminals of the switching circuit to detect the voltage of each battery module, wherein the filter circuit includes a resistor-and-capacitor arrangement including resistors that are connected between the input terminals and the output terminals of the filter circuit, respectively, and capacitors that are connected between output terminals of the filter circuit, respectively, to have a characteristic of a low-pass filter, and wherein the resistor-and-capacitor configuration of the low-pass filter is determined by adjusting a resistance value and position of the resistor in the resistor-and-capacitor arrangement as well as capacitance and position of the capacitor in the resistor-and-capacitor arrangement, so that frequency response is kept constant when the voltage of the plurality of battery modules is detected.

2. The battery module voltage detector according to claim 1, wherein when "M" and "N" are a positive integer, the resistor-and-capacitor arrangement is made up of (M+1) resistors having an equal resistance value to connect an N-th input terminal of the filter circuit to an N-th output terminal of the filter circuit, and M capacitors whose terminals are connected between the output terminals of two adjacent resistors out of the (M+1) resistors, and wherein when capacitance of the capacitor corresponding to a first battery module is regarded as "one", capacitance ratio of the capacitor corresponding to an N-th battery module is expressed as "N(M−N+1)/M".

3. The battery module voltage detector according to claim 1, wherein, when the number of battery modules is "M" being a positive and uneven integer and "N" is a positive integer, the resistor-and-capacitor arrangement is made up of (M+1) resistors having an equal resistance value to connect an N-th input terminal of the filter circuit to an N-th output terminal of the filter circuit, and (M+1)/2 capacitors having equal capacitance and connected to the output terminals of N-th and (M+2−N)-th resistors out of the (M+1) resistors.

4. The battery module voltage detector according to claim 1, wherein when the number of battery modules is "M" being a positive and even integer and "N" is a positive integer, the resistor-and-capacitor arrangement is made up of a resistor having an arbitrary resistance value, including a zero ohm resistor, to connect M/2-th input terminal of the filter circuit to M/2-th output terminal of the filter circuit, M resistors having an equal resistance value to connect an N-th input terminal of the filter circuit to an N-th output terminal of the filter circuit, apart from M/2-th input terminal of the filter circuit, and M/2 capacitors having equal capacitance and connected between the output terminals of N-th and (M+2−N)-th resistors out of (M+1) resistors.

5. The battery module voltage detector according to claim 3 wherein when "M", "P", and "Q" are a positive integer, "P" is less than half of "M", and "Q" is not equal to "P" and less half of "M", and wherein a capacitor connected between P-th and (M+2−P)-th resistors and a capacitor between Q-th and (M+2−Q)-th resistors are replaced with a capacitor connected between the Q-th and P-th resistors, a capacitor connected between the P-th and (M+2−Q)-th resistors, a capacitor connected between the Q-th and (M+2−P)-th resistors, and a capacitor connected between the (M+2−Q)-th and (M+2−P)-th resistors, and all the capacitors have approximately equal capacitance.

6. The battery module voltage detector according to claim 4, wherein when "M", "P", and "Q" are a positive integer, "P" is less than half of "M", and "Q" is not equal to "P" and less half of "M", and wherein a capacitor connected between P-th and (M+2−P)-th resistors and a capacitor between Q-th and (M+2−Q)-th resistors are replaced with a capacitor connected between the Q-th and P-th resistors, a capacitor connected between the P-th and (M+2−Q)-th resistors, a capacitor connected between the Q-th and (M+2−P)-th resistors, and a capacitor connected between the (M+2−Q)-th and (M+2−P)-th resistors, and all the capacitors have approximately equal capacitance.

7. The battery module voltage detector according to claim 1, wherein "M" is a positive integer, and a resistor connected between M/2-th input terminal of the filter circuit and M/2-th output terminal of the filter circuit is replaced with a wire.

8. The battery module voltage detector according to claim 1, wherein the resistor is provided as a dummy load by a switching capacitor method of providing the capacitor and a plurality of switches.

9. The battery module voltage detector according to claim 1, wherein the switching circuit is an analog multiplexer integrally and separately constituted with the voltage detecting circuit.

10. The battery module voltage detector according to claim 1, wherein the filter circuit includes:
   (M+1) input terminals connected to the voltage detecting terminals;
   (M+1) output terminals that are connected to the voltage detector through the switch circuit;
   (M+1) resistors connected between the input terminals and output terminals of the filter circuit, respectively, the resistors having substantially the same resistance except (1+M/2)-th resistor; and
   M capacitors connected between an output terminal of a (1+M/2)-th resistor and an N-th resistor, N being one to (M+1) except a (1+M/2), the (1+M/2)-th resistor and the N-th resistor being successively counted from the resistor connected to the positive electrode of the battery module having a highest potential or the negative electrode of a battery module having a lowest potential.

11. The battery module voltage detector according to claim 10, wherein the (1+M/2)-th resistor has a smaller resistance than the other resistors.

12. The battery module voltage detector according to claim 10, wherein the (1+M/2)-th resistor comprises a conductor wire.

* * * * *